United States Patent
Xu et al.

(10) Patent No.: US 10,971,584 B2
(45) Date of Patent: Apr. 6, 2021

(54) LOW CONTACT RESISTANCE NANOWIRE FETS

(71) Applicant: INTERNATIONAL BUSINESS MACHINES CORPORATION, Armonk, NY (US)

(72) Inventors: Peng Xu, Santa Clara, CA (US); Juntao Li, Cohoes, NY (US); Choonghyun Lee, Rensselaer, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/914,135

(22) Filed: Mar. 7, 2018

(65) Prior Publication Data

US 2019/0280088 A1 Sep. 12, 2019

(51) Int. Cl.
| | |
|---|---|
| *H01L 29/06* | (2006.01) |
| *H01L 29/08* | (2006.01) |
| *H01L 21/06* | (2006.01) |
| *H01L 29/66* | (2006.01) |
| *H01L 21/02* | (2006.01) |
| *H01L 21/3065* | (2006.01) |
| *H01L 29/423* | (2006.01) |
| *H01L 29/78* | (2006.01) |
| *H01L 29/786* | (2006.01) |
| *H01L 21/3105* | (2006.01) |

(52) U.S. Cl.
CPC .... *H01L 29/0673* (2013.01); *H01L 21/02112* (2013.01); *H01L 21/02532* (2013.01); *H01L 21/3065* (2013.01); *H01L 29/0847* (2013.01); *H01L 29/42392* (2013.01); *H01L 29/6656* (2013.01); *H01L 29/66439* (2013.01); *H01L 29/66545* (2013.01); *H01L 29/66553* (2013.01); *H01L 29/66742* (2013.01); *H01L 29/66795* (2013.01); *H01L 29/785* (2013.01); *H01L 29/78651* (2013.01); *H01L 29/78696* (2013.01); *H01L 21/31053* (2013.01)

(58) Field of Classification Search
None
See application file for complete search history.

(56) References Cited

U.S. PATENT DOCUMENTS

| 8,871,576 B2 | 10/2014 | Tekleab et al. |
| 8,895,417 B2 | 11/2014 | Afzali-Ardakani et al. |
| 9,171,715 B2 | 1/2015 | Matero |

(Continued)

*Primary Examiner* — Zandra V Smith
*Assistant Examiner* — Lawrence C Tynes, Jr.
(74) *Attorney, Agent, or Firm* — Tutunjian & Bitetto, P.C.; Randall Bluestone

(57) ABSTRACT

Systems and methods for forming a low contact resistance nanowire transistor are described. The transistor includes a gate formed over a substrate including a gate conductor. Gate spacers are formed on sides of the gate. At least one semiconductor nanowire is formed through the gate such that the at least one semiconductor nanowire extends through the gate conductor and the gate spacers and into source and drain regions grown from surfaces of the at least one semiconductor nanowire adjacent to sides of the gate to increase the surface area of the source drain region contacting the semiconductor nanowire.

14 Claims, 21 Drawing Sheets

(56) References Cited

U.S. PATENT DOCUMENTS

| | | | |
|---|---|---|---|
| 9,252,252 | B2 | 2/2016 | De Micheli et al. |
| 9,318,552 | B2 | 4/2016 | Xie et al. |
| 9,647,139 | B2 | 5/2017 | Doris et al. |
| 9,773,865 | B2 | 9/2017 | Chan et al. |
| 2013/0313524 | A1 | 11/2013 | De Micheli et al. |
| 2013/0316513 | A1 | 11/2013 | Basker et al. |
| 2013/0341596 | A1 | 12/2013 | Chang et al. |
| 2016/0365440 | A1* | 12/2016 | Suk .................. H01L 29/42392 |
| 2017/0053998 | A1* | 2/2017 | Kim ..................... H01L 21/764 |
| 2017/0221708 | A1 | 8/2017 | Bergendahl et al. |
| 2018/0315817 | A1* | 11/2018 | Van Dal .............. H01L 29/0673 |
| 2018/0342596 | A1* | 11/2018 | Lee .................... H01L 29/6656 |
| 2019/0131415 | A1* | 5/2019 | Cheng ................ H01L 29/1033 |

* cited by examiner

LOW CONTACT RESISTANCE NANOWIRE FETS

BACKGROUND

Technical Field

The present invention generally relates to the formation of field-effect transistors (FETs), and more particularly to the formation of low contact resistance nanowire FETs.

Description of the Related Art

Complimentary metal-oxide semiconductors (CMOS) provide benefits to the speed and efficiency of field-effect transistors (FETs), and other devices. However, shrinking source and drain (S/D) regions of the FETs that contact the semiconductor of the CMOS for the movement of current across the device from source to drain can result in a reduced cross-sectional area for the formation of the S/D regions. This process can make the formation of the S/D regions difficult and can affect the efficiency and speed of the device.

SUMMARY

In accordance with an embodiment of the present invention, a method for forming a low contact resistance nanowire transistor. The method includes forming a stack of nanowires having alternating nanowire layers including first nanowires and second nanowires. Further included is a step for recessing each of the first nanowires such that each of the second nanowires extend beyond the first nanowires. Source and drain regions are grown from surfaces of the second nanowires beyond a width defined by outer surfaces of gate spacers such that the second nanowires extend into the source and drain regions outside of the width defined by outer surfaces of gate spacers. A gate is formed between the gate spacers including replacing the recessed first nanowires with a gate conductor such that the second nanowire extends through the gate conductor.

In accordance with an embodiment of the present invention, a method for forming a low contact resistance nanowire transistor. The method includes forming gate spacers on a dummy gate over a nanowire stack formed on a substrate, the nanowire stack including alternating nanowires of first nanowires and second nanowires. Each of the first nanowires is recessed such that the first nanowires are disposed within a width defined by outer surfaces of the gate spacers while the second nanowires extend beyond the width defined by the outer surfaces of the gate spacers. An oxide fill is deposited over the substrate such that the oxide fill is disposed between the second nanowires and in contact with ends of the first nanowires. The oxide fill is annealed to form inner spacers at the ends of the first nanowires. Source and drain regions are grown from surfaces of the second nanowires beyond the width defined by the outer surfaces of the gate spacers such that the second nanowires extend into the source and drain regions outside of the gate spacers. The dummy gate is replaced and the recessed first nanowires with a gate conductor to form a gate such that the second nanowire extends through the gate conductor.

In accordance with an embodiment of the present invention, a low contact resistance nanowire transistor is described. The transistor includes a gate formed over a substrate including a gate conductor. Gate spacers are formed on sides of the gate. At least one semiconductor nanowire is formed through the gate conductor such that the at least one semiconductor nanowire extends beyond the gate spacers into source and drain regions grown from surfaces of the at least one semiconductor nanowire.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
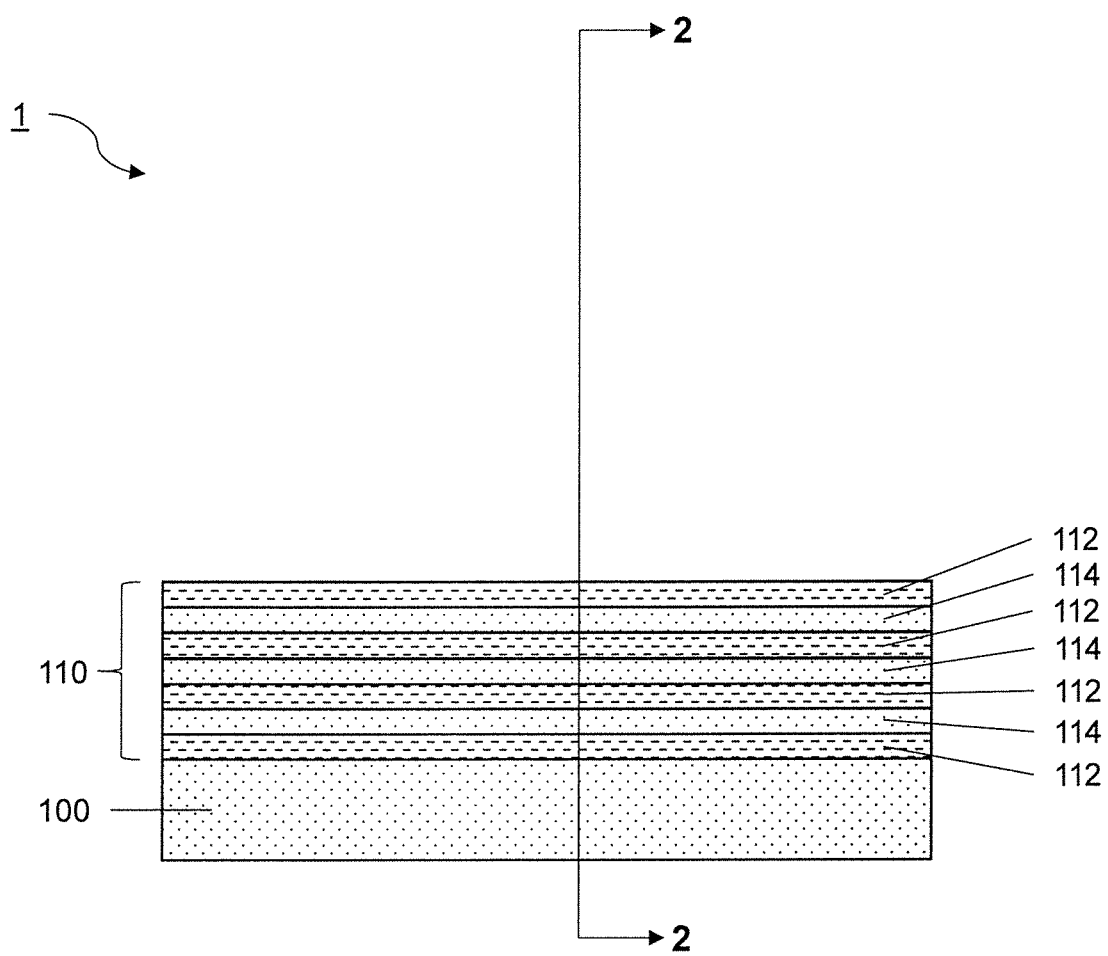
FIG. 1 is a cross-sectional view showing a stacked nanowire substrate for a fin-type field-effect transistor (fin FET), in accordance with an embodiment of the present invention.

Shrinking the size of semiconductor devices is useful for decreasing device real-estate, as well as improving the efficiency and speed of the devices. Such devices can include field-effect transistors (FETs). By incorporating nanowires into the semiconductor devices, including FETs, the electrical properties of the devices can be improved, enabling a decrease in size of the devices. However, decreasing the size of the devices, S/D regions will become harder to form due to decreased surface area of the nanowires.

To facilitate further decrease in semiconductor device size, nanowire FETs with unchopped nanowires are contemplated. These nanowire FETs are formed from nanowire semiconductors in, e.g., fin configurations. A gate can be formed over the fins of the nanowire FETs, with sacrificial nanowires being recessed. However, the semiconductor nanowires are not recessed. Rather, a fill material is employed to fill a device region such that, upon annealing the fill material, the fill material interacts with surfaces of the sacrificial nanowires to form self-aligned inner spacers at interfaces between the sacrificial nanowires and the fill material. Possible fill materials can include an oxide, such as e.g., germanium oxide ($GeO_2$), silicon germanium oxide ($SiGeO_x$), or any other fill material suitable for generating a self-aligned inner spacer at an interface between the fill material and a sacrificial nanowire. Upon forming the self-aligned inner spaces, the fill material may be removed to permit further processing steps.

Accordingly, full length semiconductor nanowires are maintained in the device region, while inner spacers were formed on the sacrificial nanowires. By avoiding chopping the semiconductor nanowires, the semiconductor nanowires extend beyond the inner spaces and a gate region. As a result, multiple surfaces of the semiconductor nanowires are exposed, thus increasing the surface area of the exposed portions of the semiconductor nanowires. These surfaces can all be used for the growth of S/D material to form S/D regions.

The S/D material can be formed with a large surface to growth epitaxy that results in higher quality growth of the S/D regions, as well as decreasing the contact resistance between the S/D regions and the semiconductor nanowires. The high-quality S/D growth as well as the low contact resistance can improve the electrical properties of the nanowire FETs by improving the flow of current. As a result, the nanowire FETs can exhibit lower resistance, faster speeds, and higher efficiency, thus improving the nanowire FETs.

Exemplary applications/uses to which the present invention can be applied include, but are not limited to: semiconductor device and semiconductor device fabrication, including transistors, such as, e.g., field-effect transistors of fin type, vertical, and other suitable transistor type designs.

It is to be understood that the present invention will be described in terms of a given illustrative architecture; however, other architectures, structures, substrate materials and process features and steps can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent to one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

Figure 2:
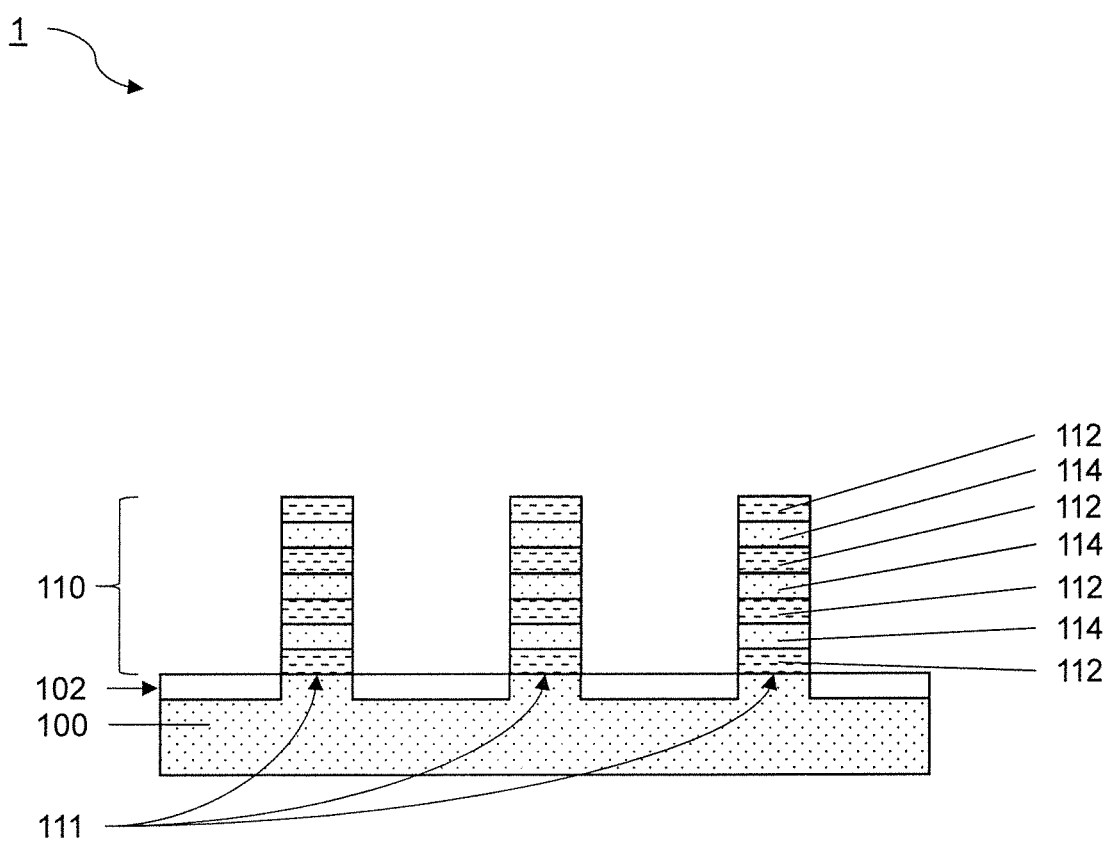
FIG. 2 is a cross-sectional view taken along line 2-2 showing a stacked nanowire substrate for a fin-type field-effect transistor (fin FET), in accordance with an embodiment of the present invention.

Referring now to the drawings in which like numerals represent the same or similar elements and initially to FIGS. 1 and 2, a stacked nanowire substrate for a fin-type field-effect transistor (fin FET) according to an illustrative embodiment of the present invention is illustrated.

Referring to FIG. 1, according to aspects of the present invention, a semiconductor device 1 can include a substrate 100 having a nanowire stack 110 formed thereon. The substrate 100 can include, e.g., monocrystalline silicon (Si), however other suitable materials can be use (for example, silicon germanium (SiGe), gallium arsenide (GaAs), silicon carbide (SiC), polycrystalline silicon, and other group IV, III-V, II-VI and semiconducting materials). Additionally, the substrate can be a silicon-on-insulator substrate or a bulk substrate including an insulating layer or buried oxide (BOX) layer formed thereon.

Formed on the substrate 100 is the nanowire stack 110 of alternating materials. The materials can include at least two semiconducting materials with differing etch selectivity. As an example, the nanowire stack 110 can include a first material for semiconductor nanowires 114 that can include Si, and a second material for sacrificial nanowires 112, including a sacrificial semiconductor material such as, e.g., SiGe. The semiconductor nanowires 114 and the sacrificial nanowires 112 can be deposited in alternating fashion to form desired number of layered nanowires (for example, two layers of each of the semiconductor nanowires 114 and sacrificial nanowires 112).

The nanowire stack 110 can be formed, e.g., from a series of deposition processes, layering each of the first and at least second material in alternating fashion. The deposition processes can include, e.g., physical vapor deposition (PVD), chemical vapor deposition (CVD), molecular beam epitaxy (MBE) and, atomic layer deposition (ALD) among others.

Referring to FIG. 2, the nanowire stack 110 can be arranged as stack of the alternating semiconductor nanowires 114 and sacrificial nanowires 112 in a fin-type arrangement. In such an arrangement, a plurality of parallel fins 111 can be formed from longitudinally arranged nanowire stacks 110 with FIG. 1 showing a side view of one such fin 111. The fins 111 can be formed using a masking and etching process, the etching process including, e.g., plasma etching, reactive ion etching (RIE), wet etching, and anisotropic wet etching, among others. In between the fins formed of nanowire stacks 110 can be an insulative material, such as, e.g., an oxide or other suitable insulator, to form shallow trench isolation (STI) regions 102.

Figure 3:
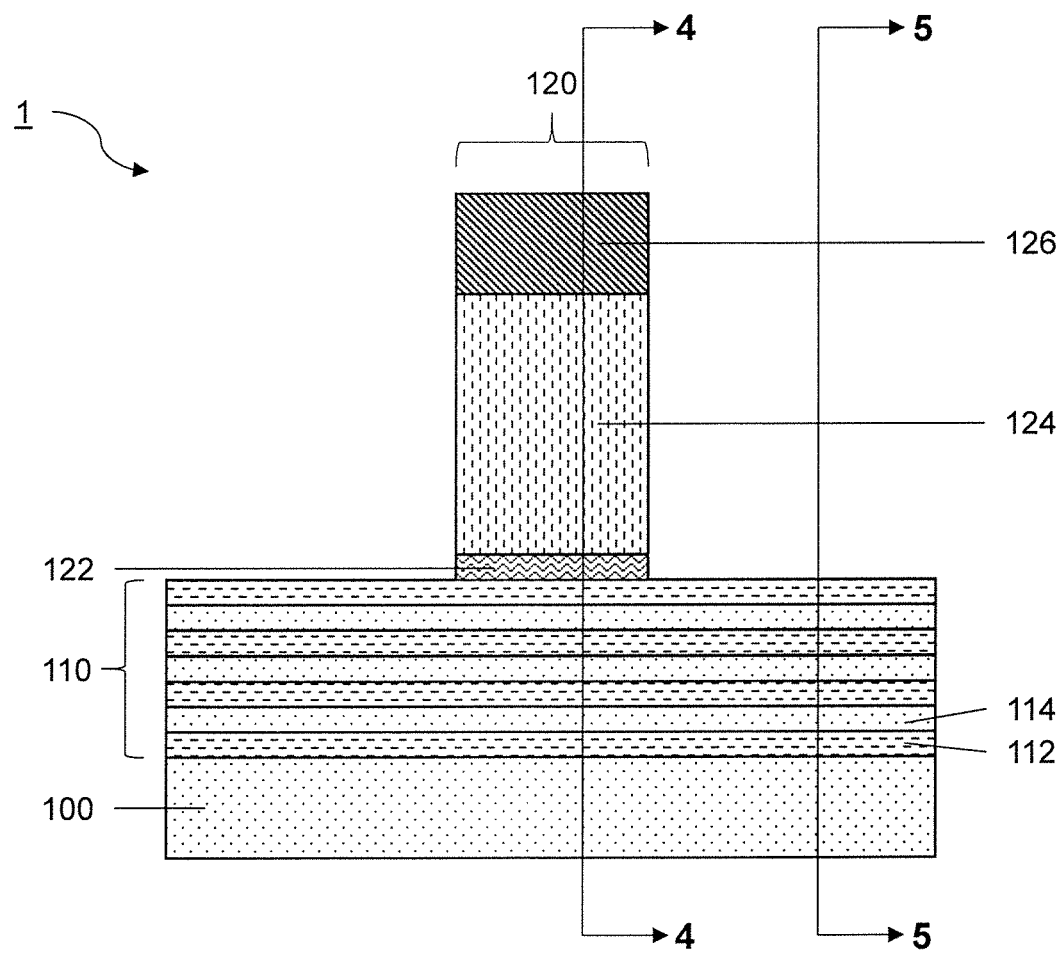
FIG. 3 is a cross-sectional view showing of a stacked nanowire fin FET with a dummy gate formed thereon, in accordance with an embodiment of the present invention.
Figure 4:
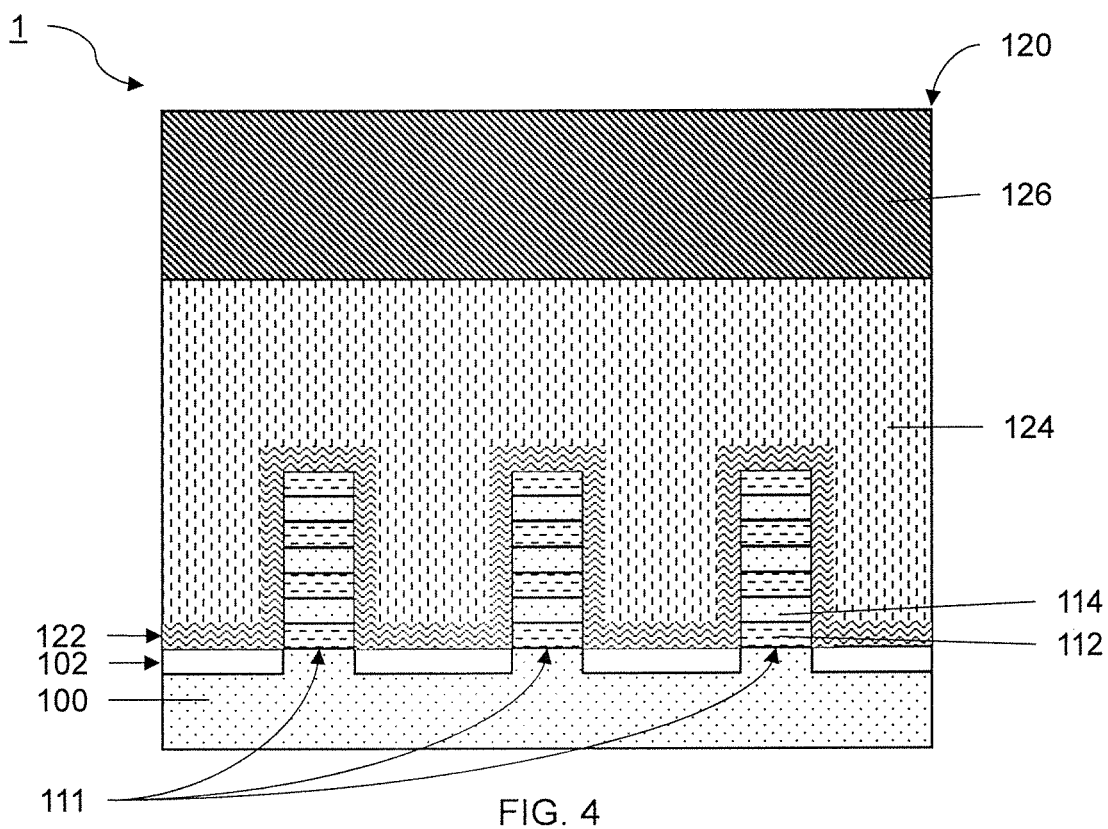
FIG. 4 is a cross-sectional view taken along line 4-4 of FIG. 3 showing of a stacked nanowire fin FET with a dummy gate formed thereon, in accordance with an embodiment of the present invention.
Figure 5:
FIG. 5 is a cross-sectional view taken along line 5-5 of FIG. 3 showing of a stacked nanowire fin FET with a dummy gate formed thereon, in accordance with an embodiment of the present invention.

Referring now to FIGS. 3-5, a stacked nanowire fin FET with a dummy gate formed thereon according to an illustrative embodiment of the present invention is illustrated.

Referring to FIGS. 4 and 5, which depict a cross section of the semiconductor device 1 along lines 4-4 and 5-5 of FIG. 3, respectively, according to aspects of the present embodiment, a dummy gate 120 can be formed over the fins 111. In the case of a plurality of fins 111 formed from a plurality of the nanowire stacks 110, the dummy gate 120 can be oriented in a transverse direction relative to each fin and across the plurality of fins 111, such as, e.g., in a perpendicular direction relative to each fin 110, as depicted in FIG. 4. Thus, the dummy gate can be formed over and around each fin 110. FIG. 5 depicts a portion of the fins 11 that are not covered by the dummy gate 120. Instead, the fins 111 are separated by STI regions 102 in the substrate 100 and open space above the STI regions 102.

Referring now to FIG. 3. the dummy gate 120 can include a single material or multiple materials. For example, the dummy gate 120 can be formed by first forming a gate dielectric 122 over the fins 111. The gate dielectric 122 can be formed by any suitable process, such as, e.g., a deposition/masking/etching process or a growth process. The gate dielectric 122 can include a suitable dielectric or insulator, such as, e.g., an oxide.

A dummy gate material 124 and dummy gate cap 126 can be formed over the gate dielectric 122. The dummy gate material 124 can include a suitable sacrificial material, such as, e.g., amorphous or polycrystalline silicon. The dummy gate cap 126 can be formed thereon from a material such as, e.g., silicon nitride (SiN) or other nitride or material suitable to serve as a hardmask for subsequent process, as will be described below.

Each of the dummy gate material 124 and the dummy gate cap 126 can be formed using a deposition process including, e.g., PVD, CVD, or other suitable deposition process. The dummy gate 120 including the dummy gate material 124 and dummy gate cap 126 can be coextensive in footprint with the gate dielectric 122.

A plurality of dummy gates 120 can be formed over the fins 111. Each of the dummy gates 120 can therefore be longitudinally spaced along the fins 111.

Figure 6:
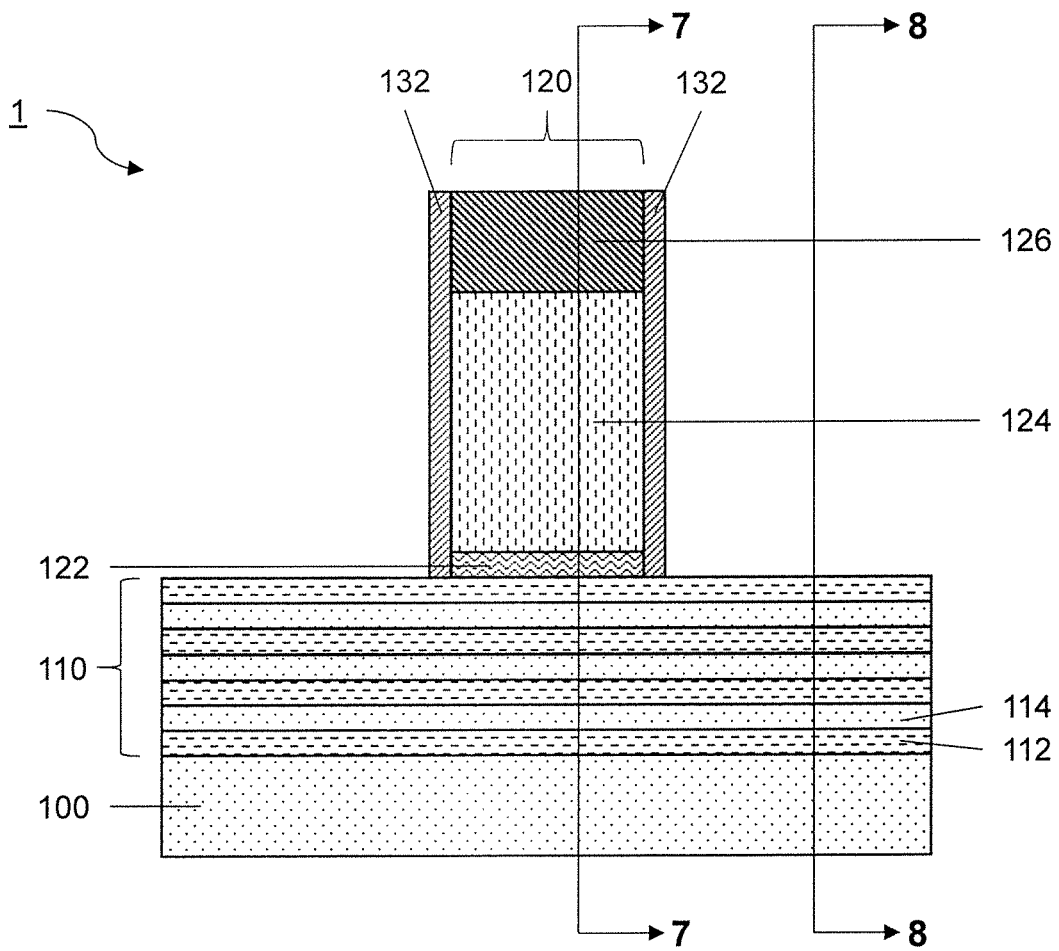
FIG. 6 is a cross-sectional view showing a stacked nanowire fin FET with spacers formed on a dummy gate, in accordance with an embodiment of the present invention.
Figure 7:
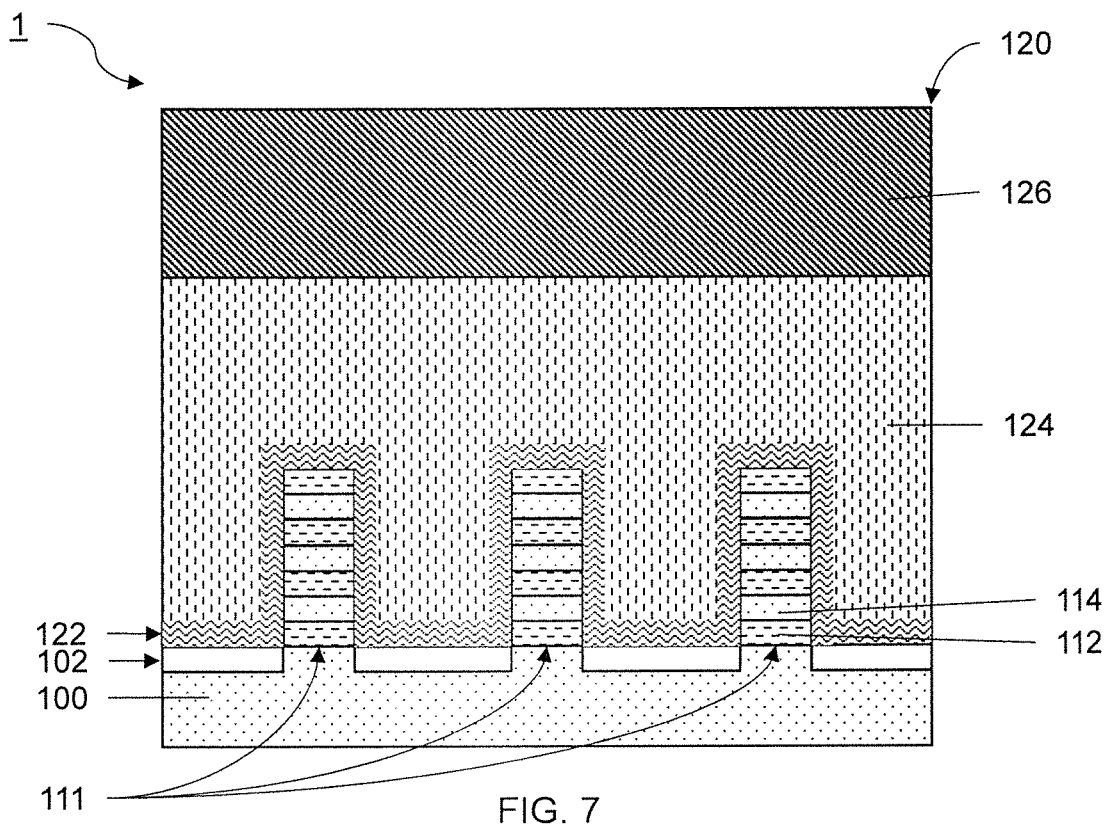
FIG. 7 is a cross-sectional view taken along line 7-7 of FIG. 6 showing a stacked nanowire fin FET with spacers formed on a dummy gate, in accordance with an embodiment of the present invention.
Figure 8:
FIG. 8 is a cross-sectional view taken along line 8-8 of FIG. 6 showing a stacked nanowire fin FET with spacers formed on a dummy gate, in accordance with an embodiment of the present invention.

Referring now to FIGS. 6-8, a stacked nanowire fin FET with spacers formed on a dummy gate according to an illustrative embodiment of the present invention is illustrated.

Referring to FIG. 6, gate spacers 132 can be formed on each side of the dummy gates 120. The gate spacers 132 can be formed, e.g., according to a conformal deposition process where a layer of the gate spacer material is conformally deposited over the semiconductor device 10. The gate spacer material on horizontal surfaces is then removed, for example, by a directional etch (e.g., reactive ion etch (RIE)), to leave only the vertical gate spacers 132.

The dummy gates 120 and their corresponding gate spacers 132 can be formed over the fins 111 on the semiconductor device 10. For example, the dummy gates 120 extends across the semiconductor device 1 perpendicularly to, and beyond the fins 111 formed from nanowire stacks 110. The dummy gates 120 and the gate spacers 132, therefore, wrap around the fins 111 in a transverse direction to the fins 111, such as, e.g., perpendicular to the fins 111.

The dummy gate material 124 and material of the dummy gate caps 126 can be a different material from the gate spacer material of the gate spacers 132. As a result, the dummy gate material 124 can be etched selective to the gate spacers 132. For example, the gate spacers 132 can include an insulating or dielectric material including, e.g., silicon boron carbon nitride (SiBCN) or other suitable low-k material.

Referring to FIG. 7, which depicts a cross section of the semiconductor device 1 along line 7-7 of FIG. 6 where the fins 111 are shown in a portion of the semiconductor device 1 covered by the dummy gate 120 including the gate dielectric 122 conformally covering the portion of the semiconductor device 1 covered by the dummy gate 120.

Referring to FIG. 8, which depicts a cross section of the semiconductor device 1 along line 8-8 of FIG. 6, where the fins 111 are shown in a portion of the semiconductor device 1 not covered by the dummy gate 120.

Figure 9:
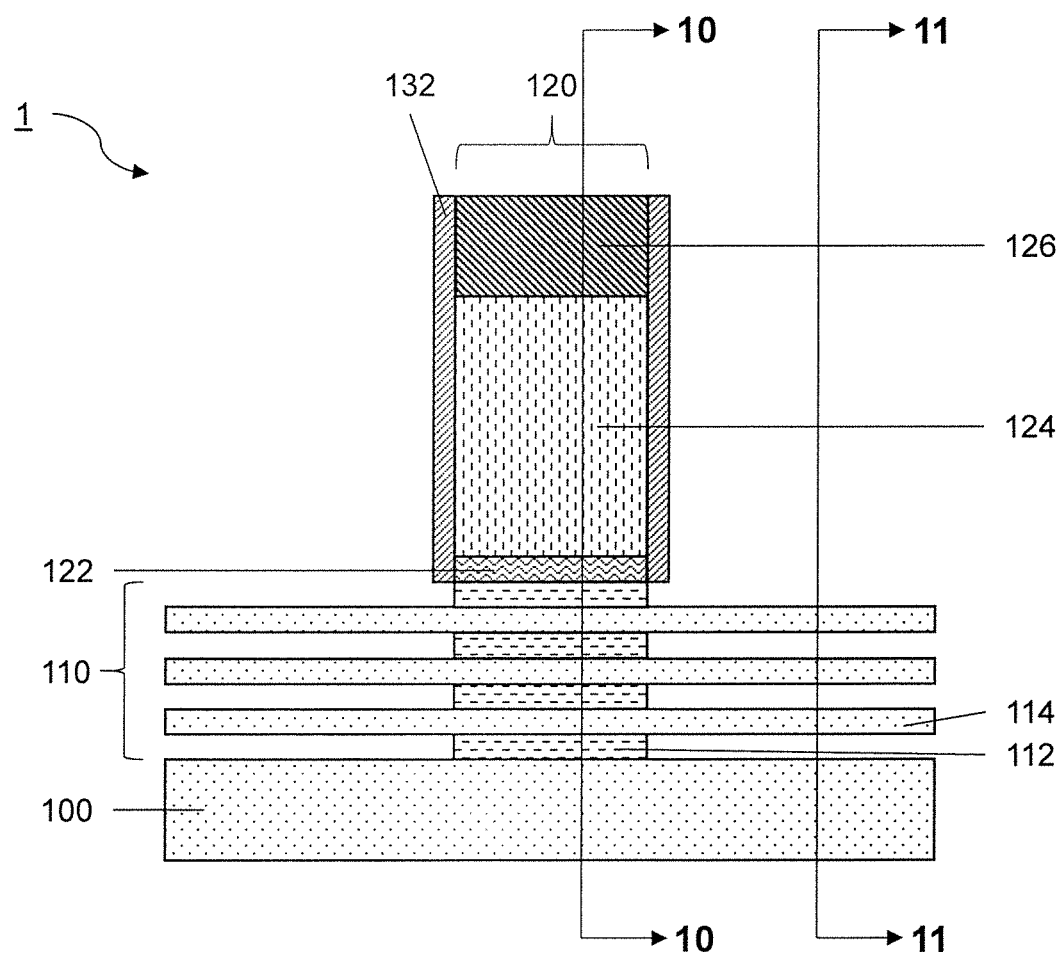
FIG. 9 is a cross-sectional view showing a stacked nanowire fin FET with recessed sacrificial nanowires, in accordance with an embodiment of the present invention.
Figure 10:
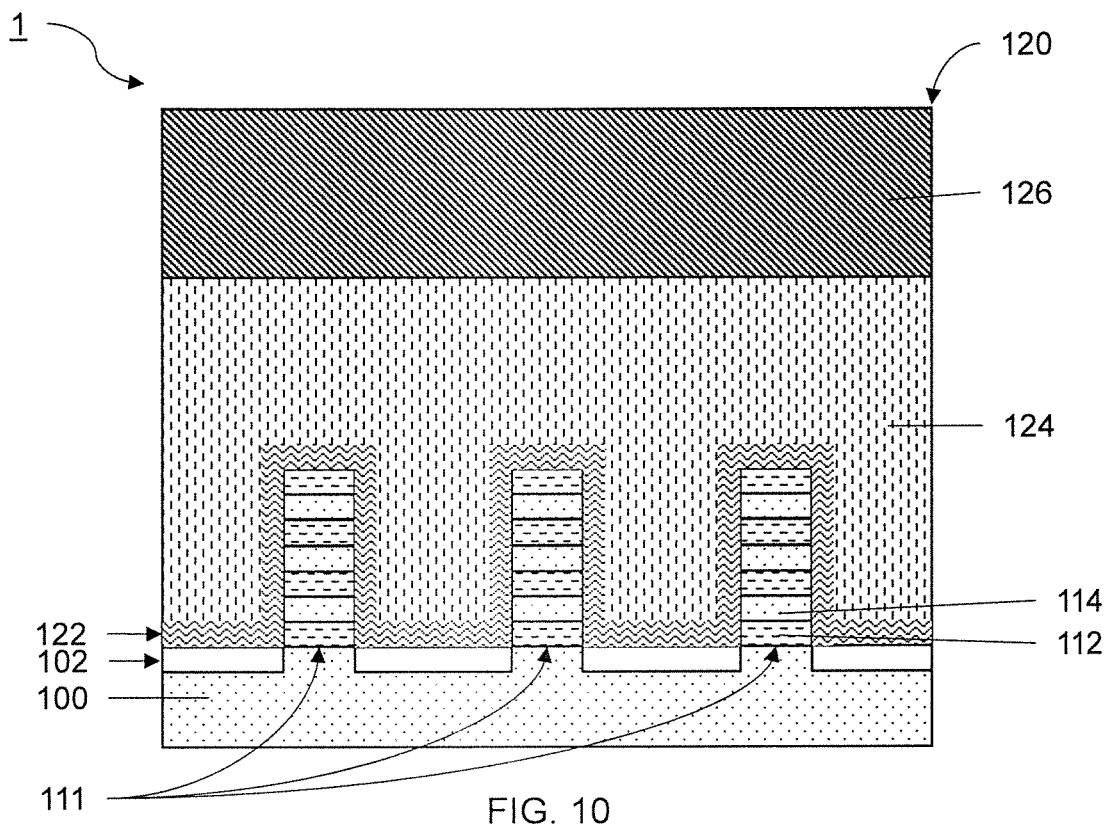
FIG. 10 is a cross-sectional view taken along line 10-10 of FIG. 9 showing a stacked nanowire fin FET with recessed sacrificial nanowires, in accordance with an embodiment of the present invention.
Figure 11:
FIG. 11 is a cross-sectional view taken along line 11-11 of FIG. 9 showing a stacked nanowire fin FET with recessed sacrificial nanowires, in accordance with an embodiment of the present invention.

Referring now to FIGS. 9-11, a stacked nanowire fin FET with recessed sacrificial nanowires according to an illustrative embodiment of the present invention is illustrated.

Referring to FIG. 9, according to aspects of the present invention, the sacrificial nanowires 112 of the nanowire stack 110 can be recessed. The sacrificial nanowires 112 can be recessed to a width relative to the dummy gate 120 that is within a footprint established by outer surfaces of the gate spacers 132. Accordingly, after recessing, a width of the footprint established by the outer surfaces of the gate spacers 132 is greater than the width of the sacrificial nanowires 112.

The recessing of the sacrificial nanowires 112 can be accomplished with a selective etch process using the dummy gate cap 126 as an etch mask. The etch process can include selectively etching the material of the sacrificial nanowires 112 selective to the semiconductor nanowires 114. For example, the sacrificial nanowires 112 can include, e.g., SiGe, that is etched with an isotropic etch process selective to semiconductor nanowires 114 including, e.g., Si. As a result, the semiconductor nanowires 114 are not altered by the recessing processing, and are thus left unchopped and at full length. The recessing process can include, e.g., an etch process including those described above, such as a directional or isotropic etch including reactive ion etching (RIE).

In the case that multiple dummy gates 120 are formed over the fins 111 and spaced longitudinal thereon, as described above, the sacrificial nanowires 112 can be recessed by a process such as the recessing process described above at each dummy gate 120 along the fins 111. As a result, an isotropic etch process can recess the sacrificial nanowires 112 as described above in a plurality of locations corresponding to each of the dummy gates 120. Thus, multiple semiconductor devices 1 can be concurrently formed on a substrate 100. Similarly, as described above, the dummy gate 120 can extend across multiple fins 111, which can each be concurrently etched to recess the sacrificial nanowires 112 of each fin 110 to concurrently form multiple semiconductor devices 1 on a given substrate 100.

Referring to FIG. 10, which depicts a cross section of the semiconductor device 1 along line 10-10 of FIG. 9 where the fins 111 are shown in a portion of the semiconductor device 1 covered by the dummy gate 120 including the gate dielectric 122 conformally covering the portion of the semiconductor device 1 covered by the dummy gate 120. As is shown, the recessed sacrificial nanowires 112 are present in the fins 111 under the dummy gate 120.

Referring to FIG. 11, which depicts a cross section of the semiconductor device 1 along line 11-11 of FIG. 9, where the fins 111 are shown in a portion of the semiconductor device 1 not covered by the dummy gate 120. As is shown, the recessed sacrificial nanowires 112 have been recessed and thus removed from the fins 111 in the portion of the semiconductor device 1 depicted in FIG. 11 and not covered by the dummy gate 120.

Figure 12:
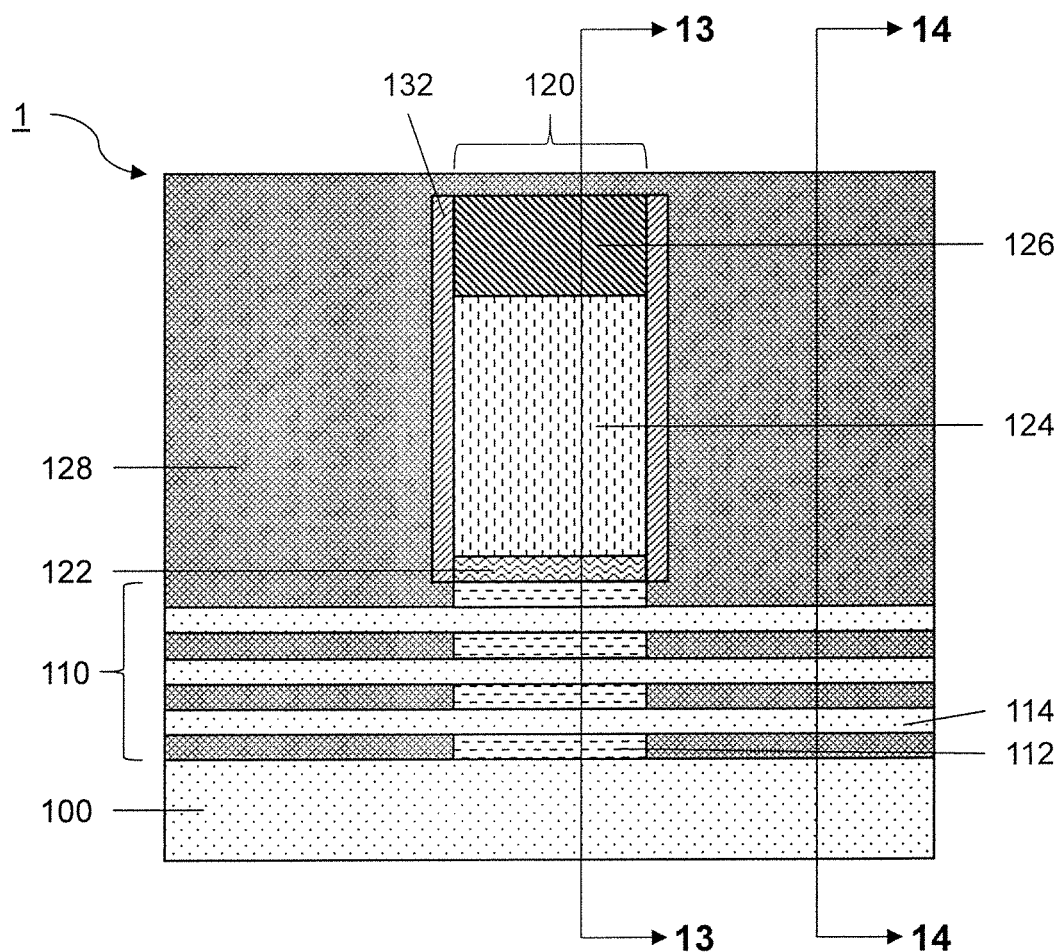
FIG. 12 is a cross-sectional view showing a stacked nanowire fin FET with an oxide fill, in accordance with an embodiment of the present invention.
Figure 13:
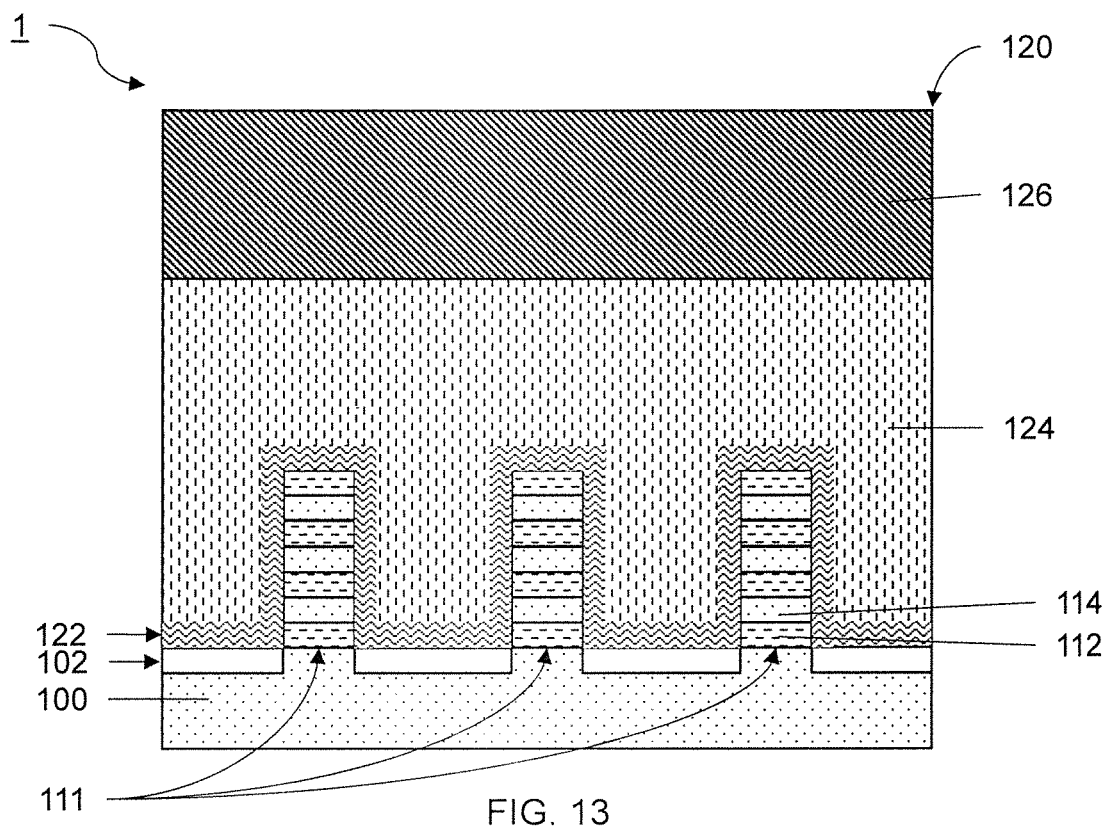
FIG. 13 is a cross-sectional view taken along line 13-13 of FIG. 12 showing a stacked nanowire fin FET with an oxide fill, in accordance with an embodiment of the present invention.
Figure 14:
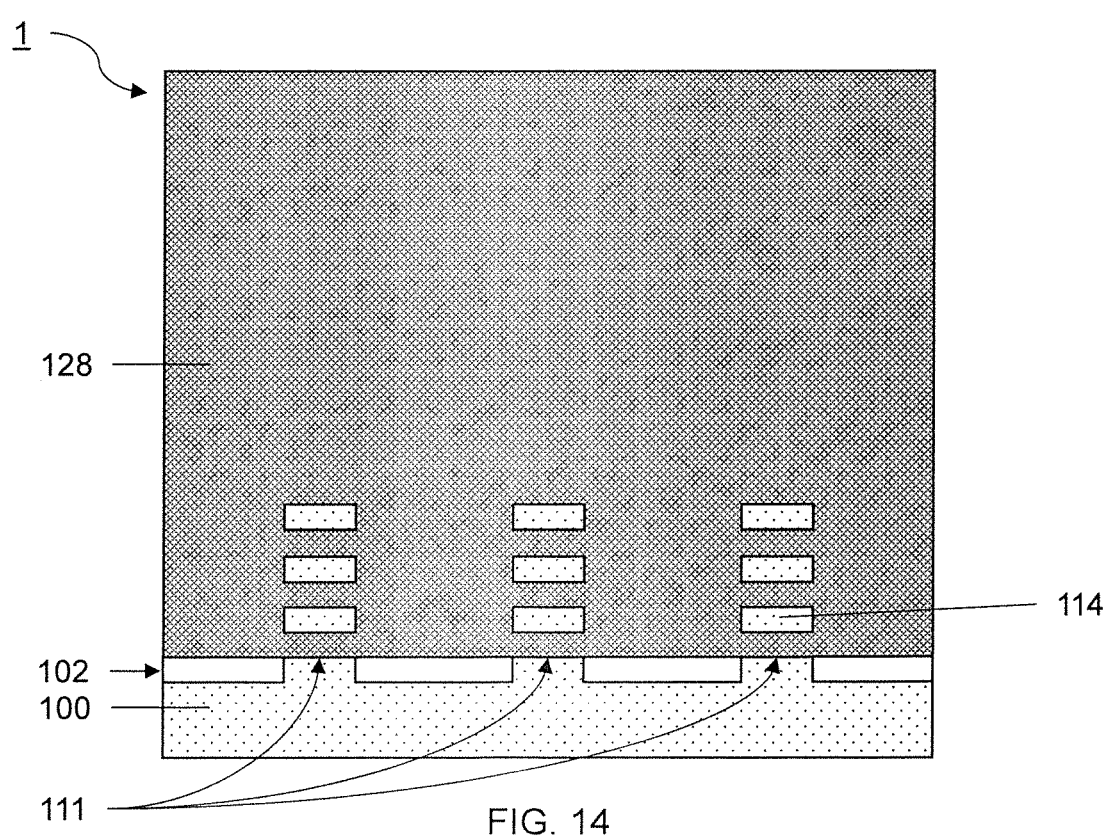
FIG. 14 is a cross-sectional view taken along line 14-14 of FIG. 12 showing a stacked nanowire fin FET with an oxide fill, in accordance with an embodiment of the present invention.

Referring now to FIGS. 12-14, a stacked nanowire fin FET with an oxide fill according to an illustrative embodiment of the present invention is illustrated.

Referring FIG. 12, the semiconductor device 1 can be buried in a fill material 128. The fill material 128 will encompass the dummy gate 120 as well as the fins 111, including filling spaces between the semiconductor nanowires 114 where the sacrificial nanowires 112 were located prior to the recessing process.

According to aspects of the present invention, the fill material 128 can include a material that is selected to be reactive with the material of the sacrificial nanowires 112. For example, where SiGe is used as the material of the sacrificial nanowires 112, the fill material 128 can include, e.g., an oxide such as germanium oxide ($GeO_2$) and a mixture of silicon oxide and germanium oxide ($SiGeO_x$).

The fill material 128 can be formed by a suitable deposition process, including those described above. The fill material 128, can then be planarized by, e.g., chemical mechanical planarization (CMP).

Referring to FIG. 13, which depicts a cross section of the semiconductor device 1 along line 13-13 of FIG. 12 where the fins 111 are shown in a portion of the semiconductor device 1 covered by the dummy gate 120 including the gate dielectric 122 conformally covering the portion of the semiconductor device 1 covered by the dummy gate 120. In this portion of the semiconductor device 10, the fins 111 are covered by the dummy gate 120 and not the fill material 128.

Referring to FIG. 14, which depicts a cross section of the semiconductor device 1 along line 14-14 of FIG. 12, where the fins 111 are shown in a portion of the semiconductor device 1 not covered by the dummy gate 120. In this portion of the semiconductor device 10, the fins 111 are covered by the fill material 128, with the fill material 128 filling in the spaces between the semiconductor nanowires 114.

Figure 15:
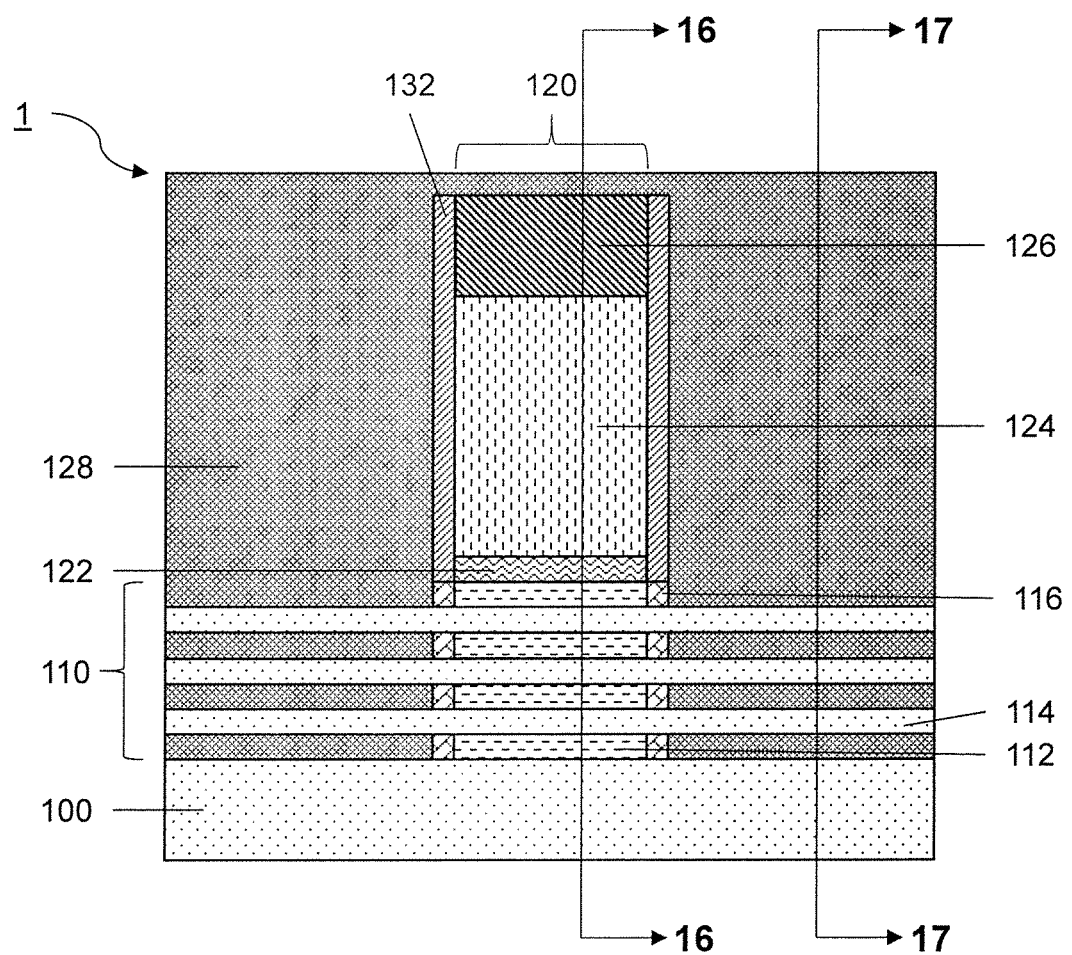
FIG. 15 is a cross-sectional view showing a stacked nanowire fin FET with inner spacers formed on recessed sacrificial nanowires, in accordance with an embodiment of the present invention.
Figure 16:
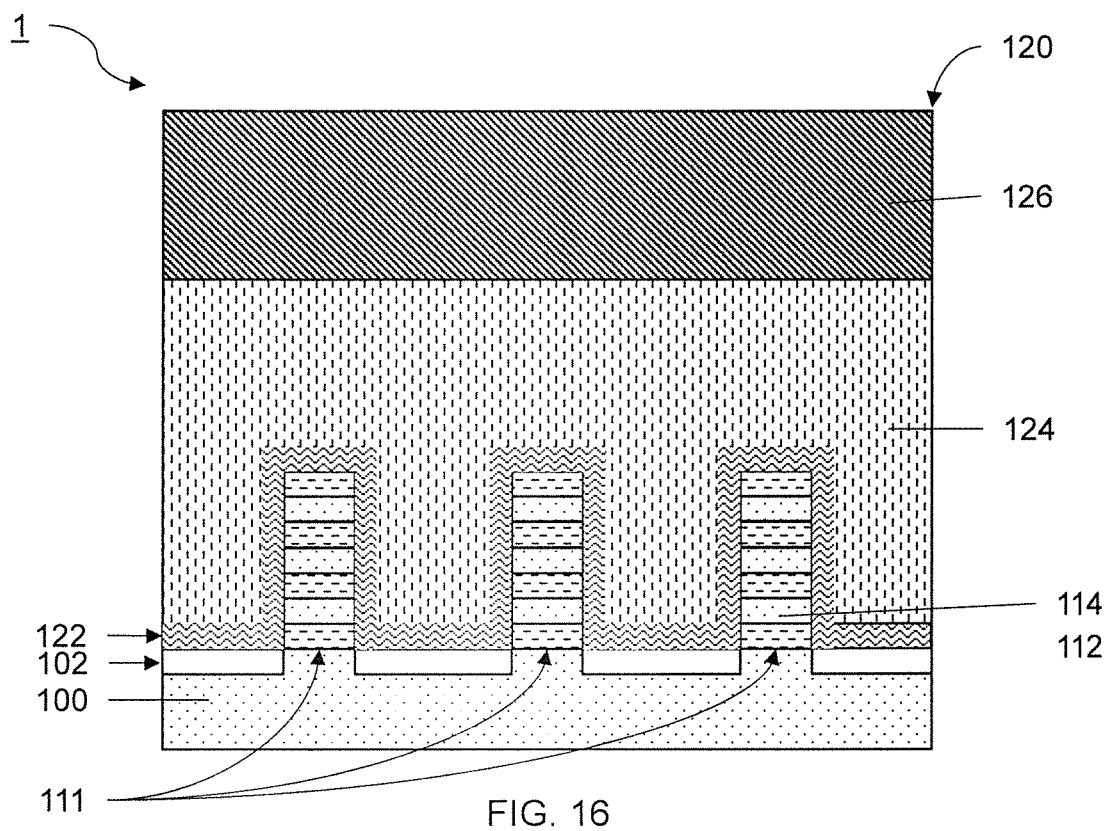
FIG. 16 is a cross-sectional view taken along line 16-16 of FIG. 15 showing a stacked nanowire fin FET with inner spacers formed on recessed sacrificial nanowires, in accordance with an embodiment of the present invention.
Figure 17:
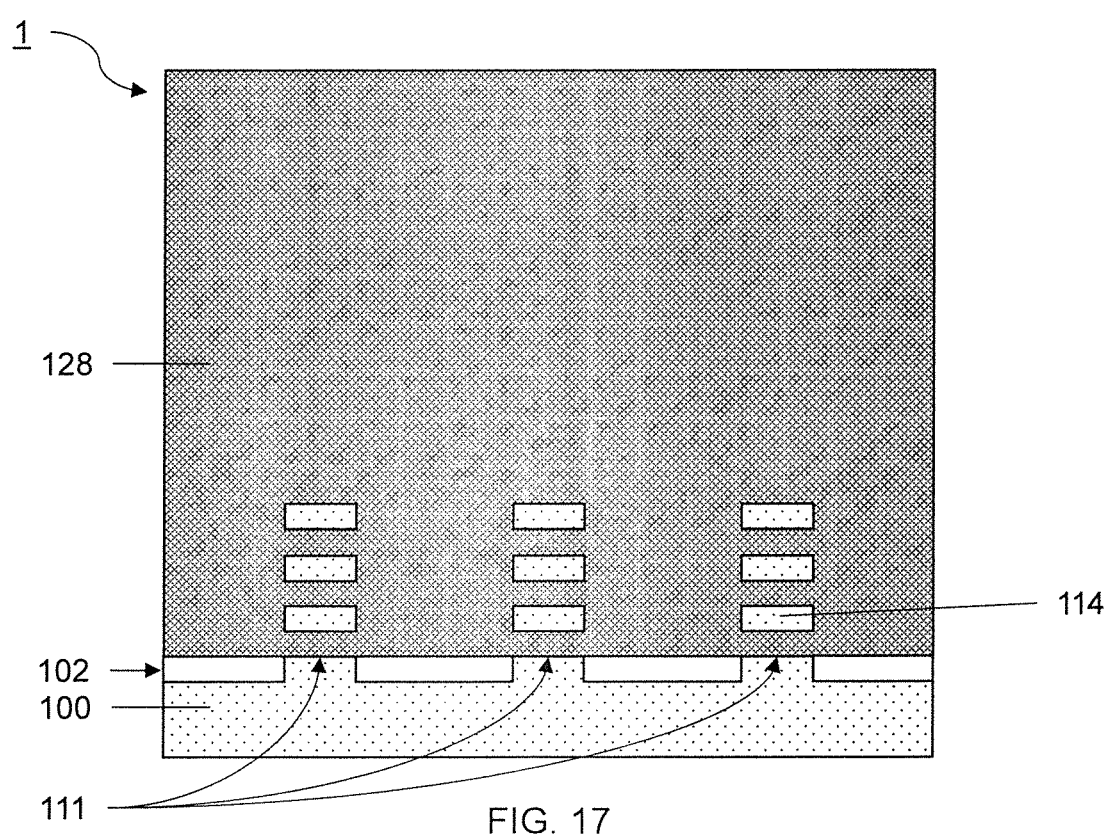
FIG. 17 is a cross-sectional view taken along line 17-17 of FIG. 15 showing a stacked nanowire fin FET with inner spacers formed on recessed sacrificial nanowires, in accordance with an embodiment of the present invention.

Referring now to FIGS. 15-17, a stacked nanowire fin FET with inner spacers formed on recessed sacrificial nanowires according to an illustrative embodiment of the present invention is illustrated.

Referring to FIG. 15, with the oxide fill 128 in place, ends of the recessed sacrificial nanowires 112 will contact the oxide fill 128 in between the semiconductor nanowires 114. Because the fill material 128 and the sacrificial nanowires 112 each include materials that are reactive to each other, the semiconductor device 1 can undergo an annealing process to cause a reaction between the fill material 128 and the sacrificial nanowires 112.

The anneal process can include, e.g., a low-temperature oxygen-free anneal, such as a low-temperature anneal with a nitrogen ambient. Accordingly, the ends of the sacrificial nanowires 112 will react with the fill material 128, and a spacer material will grow at the interface of the two materials, forming inner spacers 116 without chopping the semiconductor nanowires 114. In the case of SiGe sacrificial nanowires 112 and $GeO_2$ fill material 128, oxide inner spacers 116 will grow at the interface of the sacrificial nanowires 112 and the fill material 128. Because of this configuration, the inner spacers 116 will self-align with the gate spacers 132 outside of the sacrificial nanowires 112, while still having semiconductor nanowires 114 extending beyond the width established by the gate spacers 132.

Referring to FIG. 16, which depicts a cross section of the semiconductor device 1 along line 16-16 of FIG. 15 where the fins 111 are shown in a portion of the semiconductor device 1 covered by the dummy gate 120 including the gate dielectric 122 conformally covering the portion of the semiconductor device 1 covered by the dummy gate 120. In this portion of the semiconductor device 10, the fins 111 are covered by the dummy gate 120 and not the fill material 128.

Referring to FIG. 17, which depicts a cross section of the semiconductor device 1 along line 17-17 of FIG. 15, where the fins 111 are shown in a portion of the semiconductor device 1 not covered by the dummy gate 120. In this portion of the semiconductor device 10, the fins 111 are covered by the fill material 128, with the fill material 128 filling in the spaces between the semiconductor nanowires 114.

Figure 18:
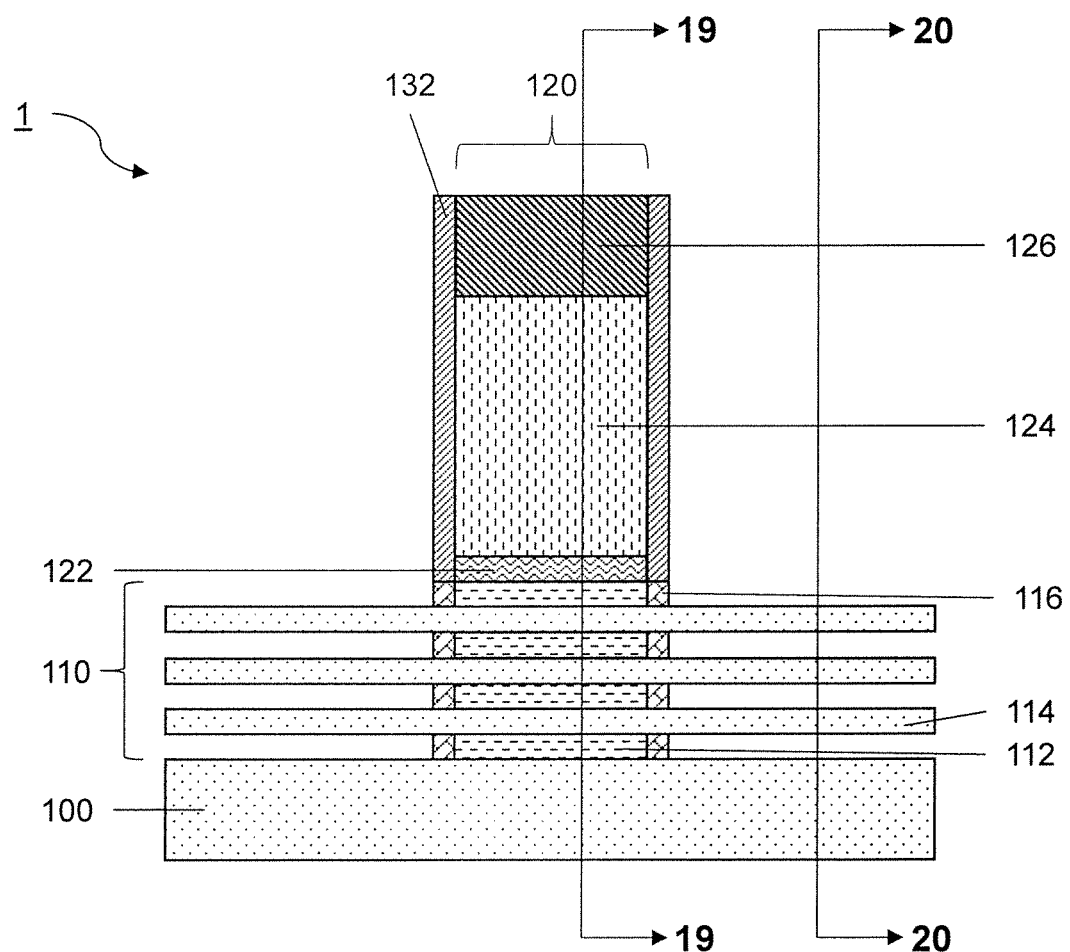
FIG. 18 is a cross-sectional view showing a stacked nanowire fin FET having unchopped semiconductor nanowires and inner spacers, in accordance with an embodiment of the present invention.
Figure 19:
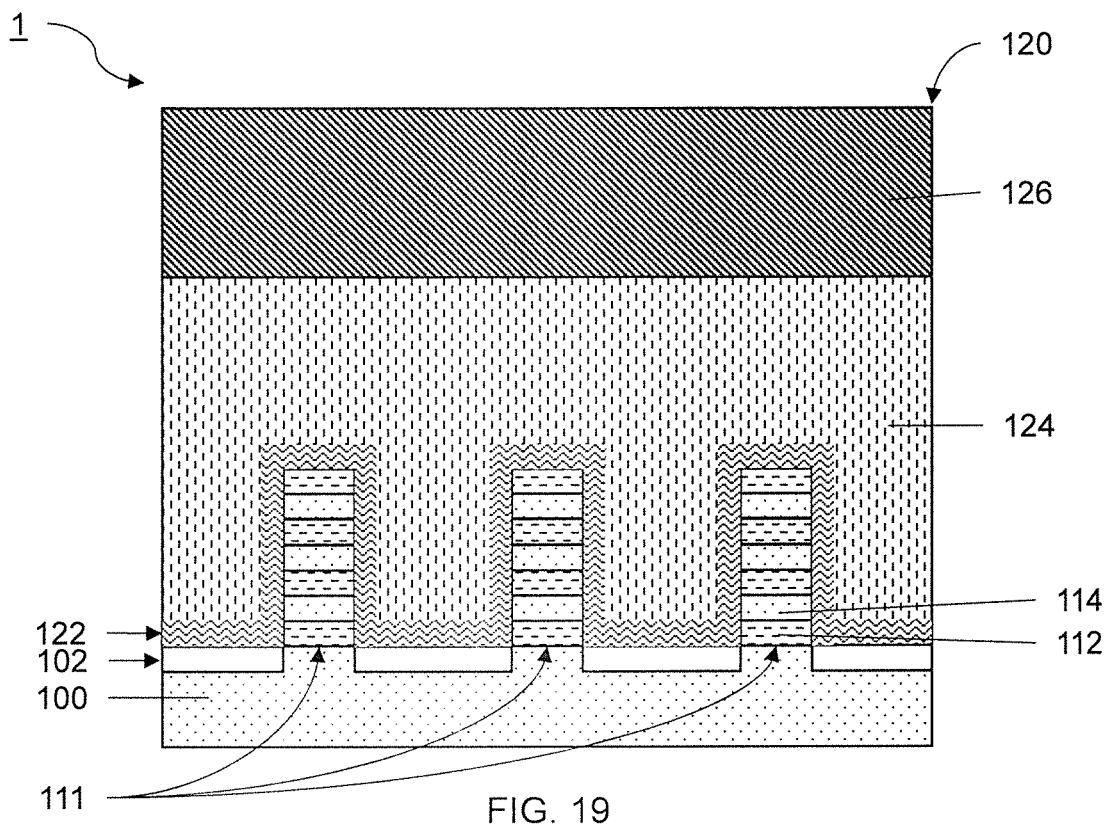
FIG. 19 is a cross-sectional view taken along line 19-19 of FIG. 18 showing a stacked nanowire fin FET having unchopped semiconductor nanowires and inner spacers, in accordance with an embodiment of the present invention.
Figure 20:
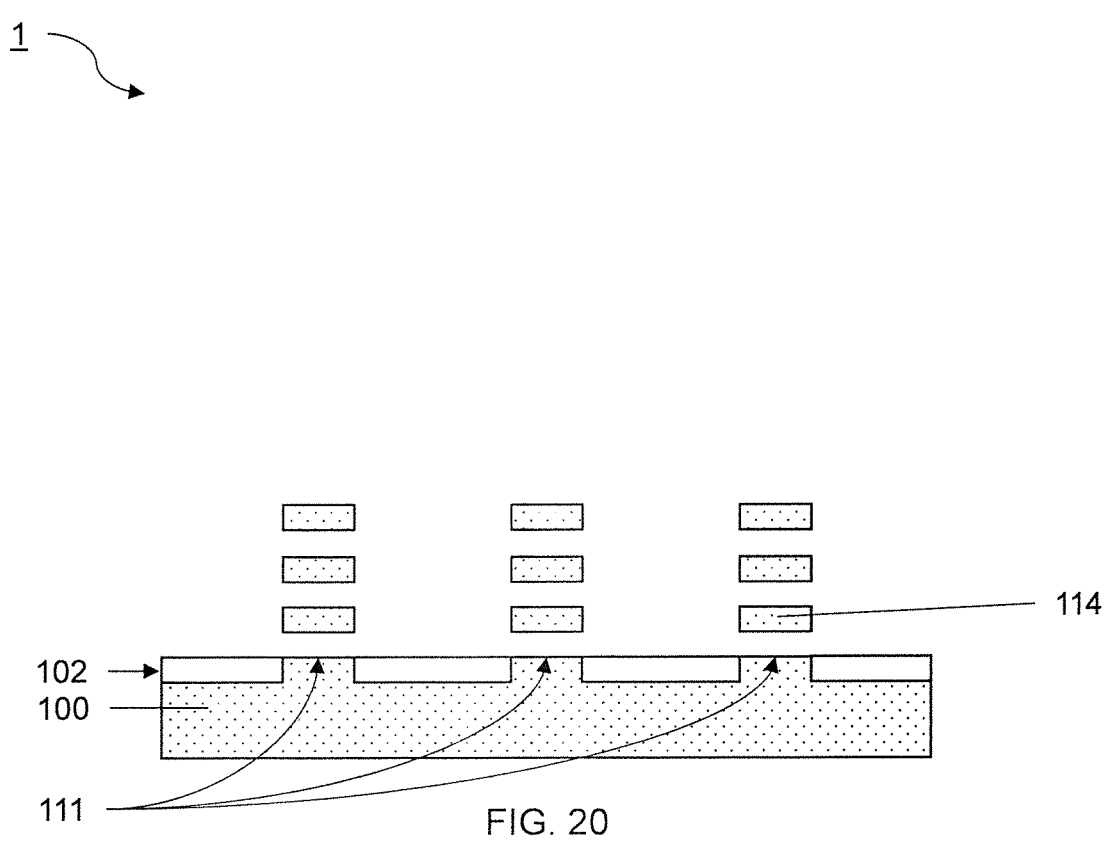
FIG. 20 is a cross-sectional view taken along line 20-20 of FIG. 18 showing a stacked nanowire fin FET having unchopped semiconductor nanowires and inner spacers, in accordance with an embodiment of the present invention.

Referring now to FIGS. 18-20, a stacked nanowire fin FET having unchopped semiconductor nanowires and inner spacers according to an illustrative embodiment of the present invention is illustrated.

Referring to FIG. 18, with gate spacers 132 and inner spacers 116 in place, the fill material 128 can be removed. The fill material 128 can be removed by a suitable process. In the case of a $GeO_2$ fill material 128, the process can include, e.g., a water ($H_2O$) wash. The wash will dissolve the fill material 128 while avoiding any damage to the semiconductor device 10. As a result, the dummy gate 120 with gate spacers 132, inner spacers 116 and sacrificial nanowires 112 will remain on the semiconductor device, with full length semiconductor nanowires 114 making up the fins 111 extending across the semiconductor device 1 through the dummy gate 120. Any process for removing the fill material 128 may be used that is suitable for removing the fill material 128 while avoiding damage to other materials such as the inner spacers 116 and semiconductor nanowires 114.

Referring to FIG. 19, which depicts a cross section of the semiconductor device 1 along line 19-19 of FIG. 18 where the fins 111 are shown in a portion of the semiconductor device 1 covered by the dummy gate 120 including the gate dielectric 122 conformally covering the portion of the semiconductor device 1 covered by the dummy gate 120.

Referring to FIG. 20, which depicts a cross section of the semiconductor device 1 along line 20-20 of FIG. 18, where the fins 111 are shown in a portion of the semiconductor device 1 not covered by the dummy gate 120.

Figure 21:
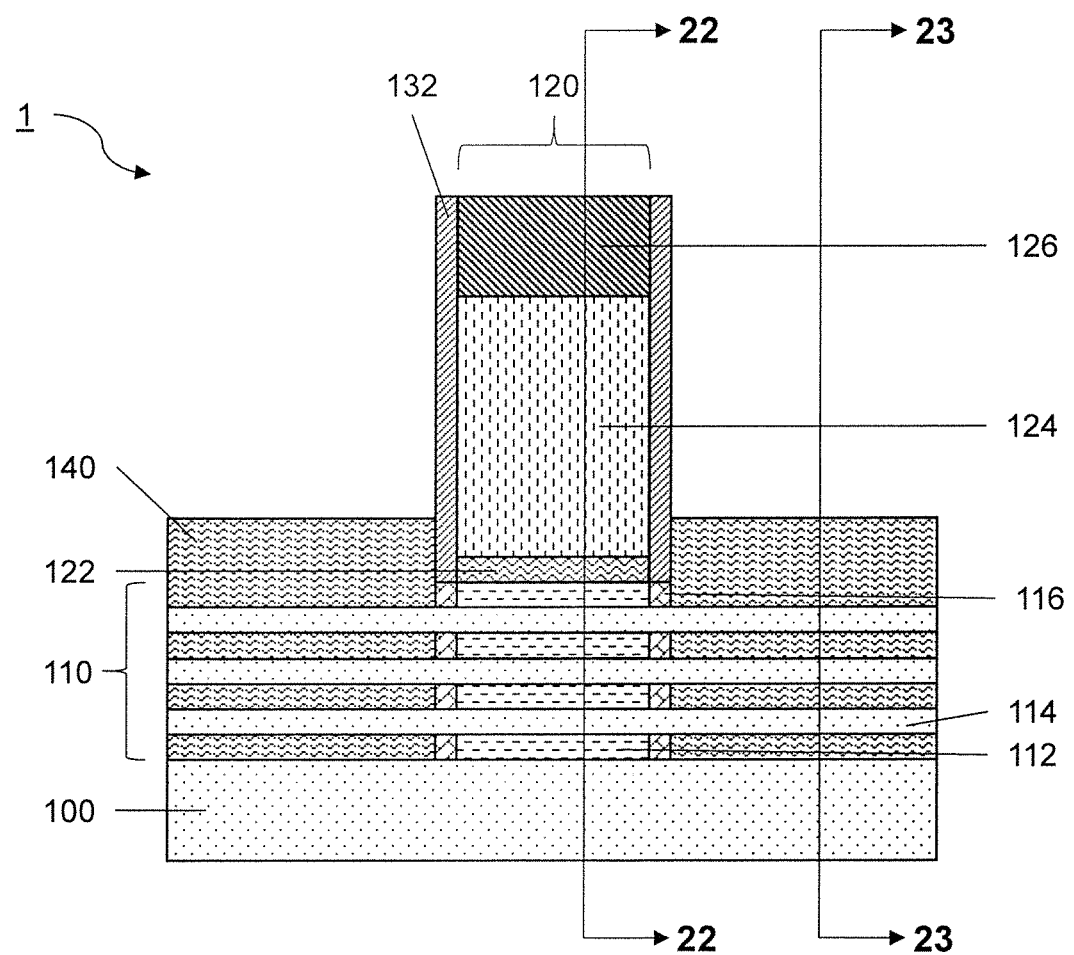
FIG. 21 is a cross-sectional view showing a stacked nanowire fin FET with source/drain regions on either side of a dummy gate, in accordance with an embodiment of the present invention.
Figure 22:
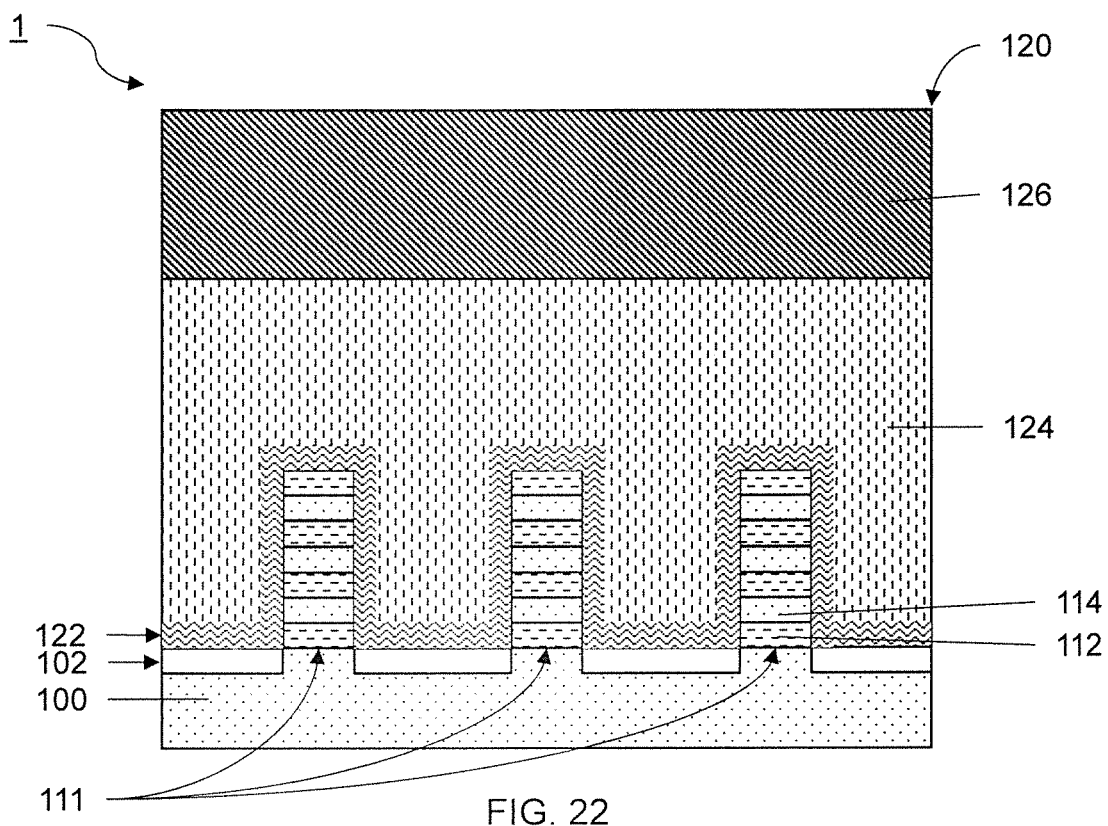
FIG. 22 is a cross-sectional view taken along line 22-22 of FIG. 21 showing a stacked nanowire fin FET with source/drain regions on either side of a dummy gate, in accordance with an embodiment of the present invention.
Figure 23:
FIG. 23 is a cross-sectional view taken along line 23-23 of FIG. 21 showing a stacked nanowire fin FET with source/drain regions on either side of a dummy gate, in accordance with an embodiment of the present invention.

Referring now to FIGS. 21-23, a stacked nanowire fin FET with source/drain regions on either side of a dummy gate according to an illustrative embodiment of the present invention is illustrated.

Referring to FIG. 21, according to aspects of the invention, source/drain regions 140 are formed adjacent to each side of the dummy gate 120. The source/drain regions 140 can be formed from a metal, or other suitable conductor.

According to aspects of the invention, the source/drain regions 140 are formed from silicon by an epitaxially growth process. However, other semiconductor materials can be used to form the source/drain regions 140. The silicon is grown from the sides of the gate spacers 132 and inner spacers 116 as well as from the surfaces of the semiconductor nanowires 114. Epitaxially growing the source/drain regions 140 improves the ability to control the portions of the dummy gate 120 that are left exposed due to greater control of dimensions of the source/drain regions 140.

Because the semiconductor nanowires 114 have been left unchopped and at full length of the fins 111, the source/drain regions 140 can be grown from surfaces of the semiconductor nanowires 114, including top and bottom surfaces. As a result, the surface area from which the source/drain regions 140 can be grown is drastically increased due to the large surface area of the semiconductor nanowires 114. This large surface area for epitaxial growth permits a large surface-to-growth epitaxy that ensures high quality growth of the source/drain regions 140. The large surface area also reduces contact resistance between the semiconductor nanowires 114 and the source/drain regions 140 compared to source/drain regions grown from chopped semiconductor nanowires. Thus, the performance of the semiconductor device 1 can be increased, including, e.g., improvements in switching speed.

The source/drain regions 140 can be grown by an epitaxially process such as, e.g., molecular beam epitaxy (MBE), vapor phase epitaxy, solid phase epitaxy, liquid phase epitaxy, or other suitable growth process. The epitaxially grown source/drain regions 140 can include a doped material that is doped, e.g., in situ, or through a separate process from the epitaxially growth of the source/drain regions 140. In the latter case, the source/drain regions 140 can be doped through diffusion or by ion implantation, and can be performed using, e.g., a separate vapor phase epitaxy step.

Referring to FIG. 22, which depicts a cross section of the semiconductor device 1 along line 22-22 of FIG. 21 where the fins 111 are shown in a portion of the semiconductor device 1 covered by the dummy gate 120 including the gate dielectric 122 conformally covering the portion of the semiconductor device 1 covered by the dummy gate 120. In this portion of the semiconductor device 10, the fins 111 are covered by the dummy gate 120 and not the fill material 128.

Referring to FIG. 23, which depicts a cross section of the semiconductor device 1 along line 23-23 of FIG. 21, where the fins 111 are shown in a portion of the semiconductor device 1 not covered by the dummy gate 120. In this portion of the semiconductor device 10, the fins 111 are covered by the source/drain regions 140, with the source/drain regions 140 filling in the spaces between the semiconductor nanowires 114.

Figure 24:
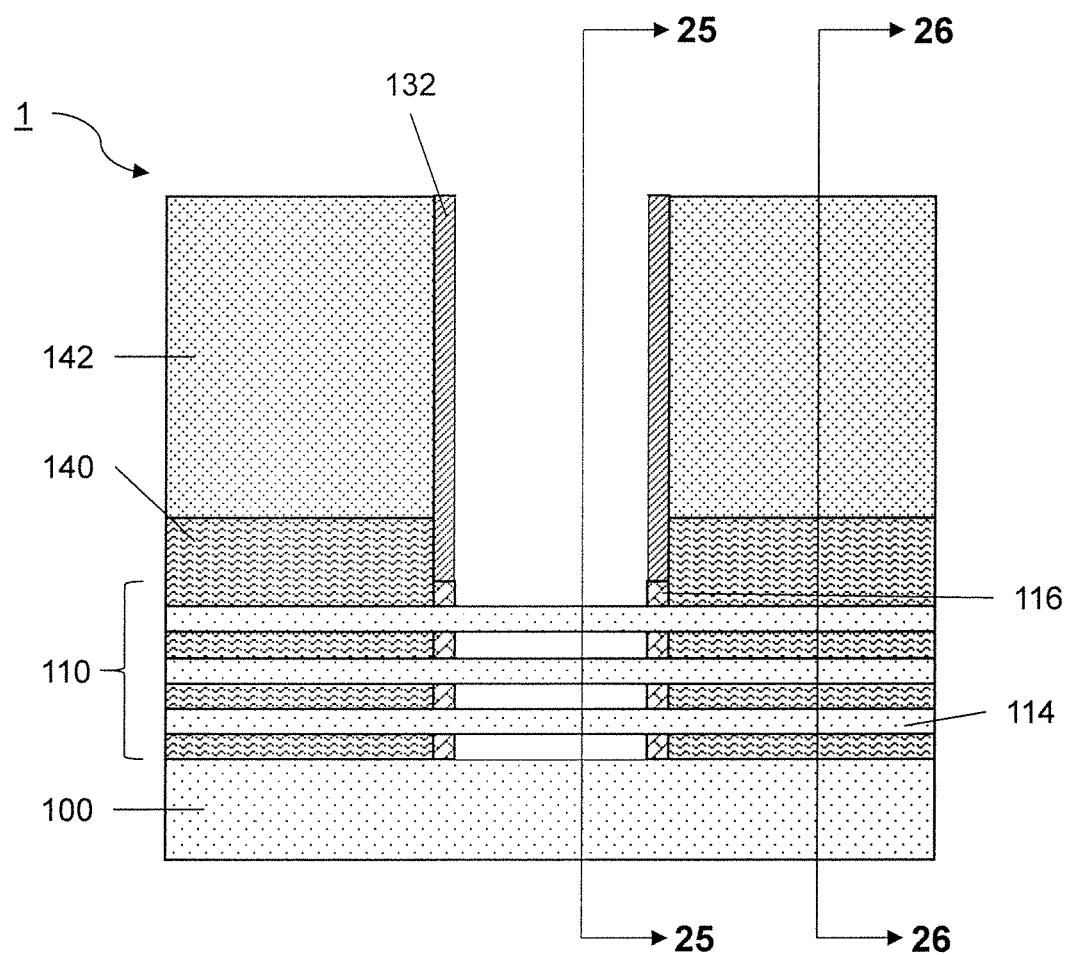
FIG. 24 is a cross-sectional view showing a stacked nanowire fin FET with a hollow gate portion and a dielectric fill outside of the gate portion, in accordance with an embodiment of the present invention.
Figure 25:
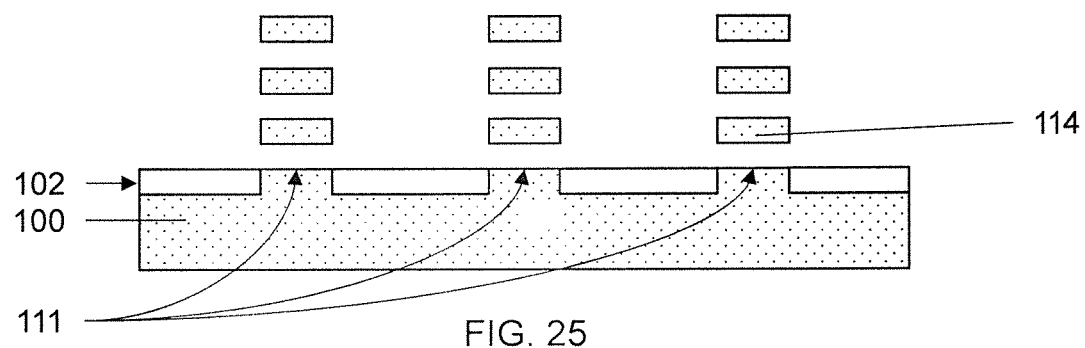
FIG. 25 is a cross-sectional view taken along line 25-25 of FIG. 24 showing a stacked nanowire fin FET with a hollow gate portion and a dielectric fill outside of the gate portion, in accordance with an embodiment of the present invention.
Figure 26:
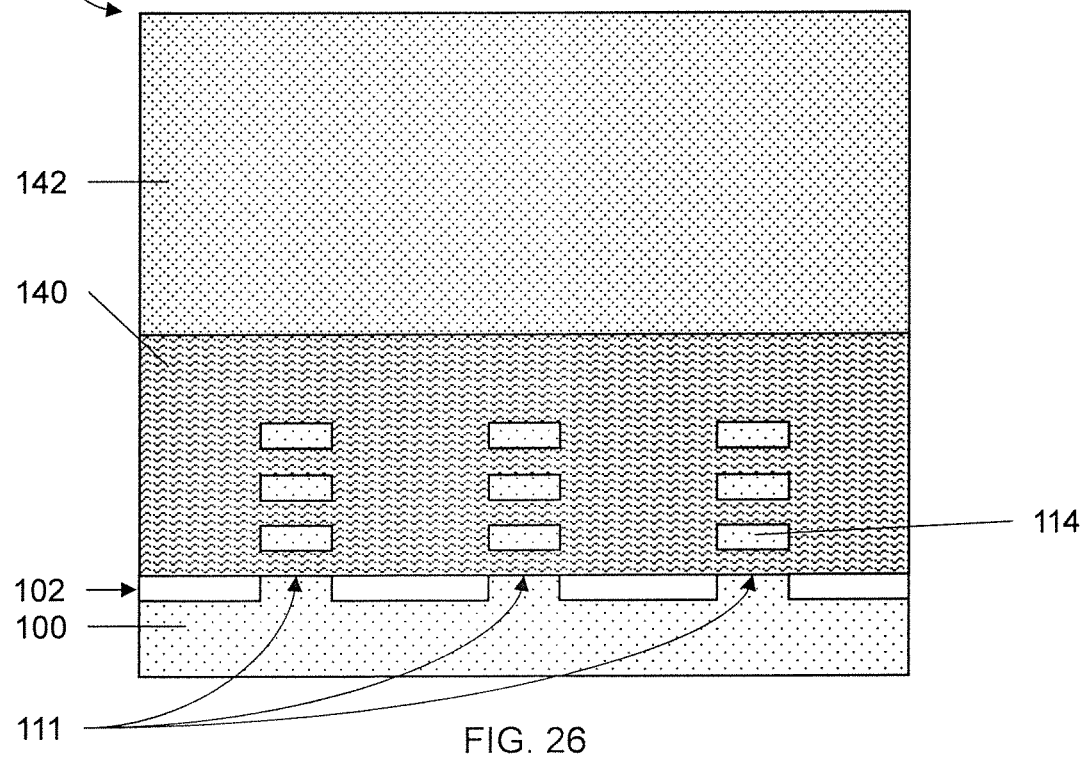
FIG. 26 is a cross-sectional view taken along line 26-26 of FIG. 24 showing a stacked nanowire fin FET with a hollow gate portion and a dielectric fill outside of the gate portion, in accordance with an embodiment of the present invention.

Referring now to FIGS. 24-26, a stacked nanowire fin FET with a hollow gate portion and a dielectric fill outside of the gate portion according to an illustrative embodiment of the present invention is illustrated.

Referring to FIG. 24, according to aspects of the invention, there can be a step for depositing an ILD 142 on the semiconductor device 10. The ILD 142 can be deposited by any suitable deposition process, such as those described above, such that the ILD 142 encompasses, and buries components of the semiconductor device 10. By encompassing the components of the semiconductor device 10, the ILD 142 insulates the various components from each other, thus reducing electrical interference between the components, such as each fin 110 formed by nanowire stacks 110 on the semiconductor device 10. To further facilitate the electrical insulation of components, the ILD 142 can be formed, for example, of a, e.g., low-k dielectric material such as silicon dioxide ($SiO_2$).

To smooth the surface topography of the ILD 142, and to expose the dummy gates 120, the ILD 142 can be planarized with a planarization process, including, e.g., chemical mechanical planarization (CMP), or any other suitable planarization process. Planarizing the ILD 142 down to the dummy gates 120 exposes the dummy gates, thus permitting access to the dummy gates 120 for subsequent processing.

The dummy gates 120 can then be removed using a suitable etch process. The etch process can be any suitable selective etch process, such as those described above. The etch process can include forming a mask over the semiconductor device 10, patterned to expose the dummy gates 120, and then apply an etch process selective to the mask.

Because the material of the dummy gate caps 126 are different from the materials of the gate spacers 132, the dummy gates 120 can be etched according to an etch selectivity from the gate spacers 132. Accordingly, the dummy gates 120 can be etched without a masking step. As such, the dummy gate caps 126 can be etched selective to the gate spacers 132 by a suitable etch process. During this etch process, or in a subsequent etch, the dummy gate material 124 can also be selectively etched and recessed down to the topmost layer of the semiconductor nanowire 114.

In the same etch process, or a subsequence etch process, the gate dielectric 122 and the sacrificial nanowires 112 can also be recessed and removed. Because the sacrificial nanowires 112 include a material different from the semiconductor nanowires 114 and the gate spacers 132 and inner spacers 116, such as, e.g., SiGe, the sacrificial nanowires 112 can be selectively etchable from those materials. Therefore, the sacrificial nanowires 112 can be removed by a selective etch process according to the etch selectivity. Accordingly, the sacrificial nanowires 112 may be removed without a masking step. As a result, the sacrificial nanowires 112 is entirely removed from between the gate spacers 132 and between the inner spacers 116, resulting a hollow stacked gate.

Referring to FIG. 25, which depicts a cross section of the semiconductor device 1 along line 25-25 of FIG. 24 where the fins 111 are shown in a portion of the semiconductor device 1 exposed after removal of the dummy gate 120, with the sacrificial nanowires 112 and the gate dielectric 122 removed.

Referring to FIG. 26, which depicts a cross section of the semiconductor device 1 along line 26-26 of FIG. 24, where the fins 111 are shown in a portion of the semiconductor device 1 not covered by the dummy gate 120. In this portion of the semiconductor device 10, the fins 111 are covered by the source/drain regions 140 and ILD 142, with the source/drain regions 140 filling in the spaces between the semiconductor nanowires 114.

Figure 27:
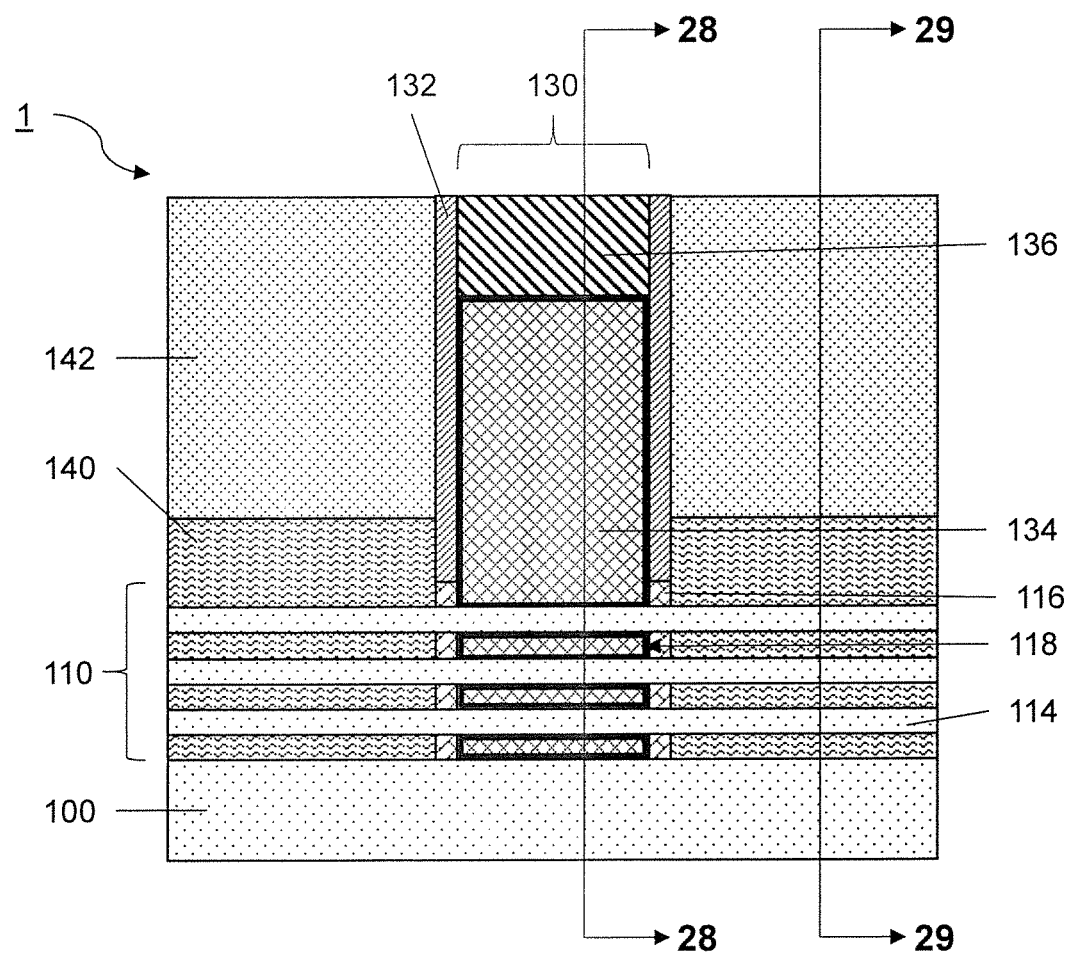
FIG. 27 is a cross-sectional view showing a stacked nanowire fin FET with a gate formed between spacers within a dielectric fill and having unchopped semiconductor nanowires with source/drain regions grown around the semiconductor nanowires, in accordance with an embodiment of the present invention.
Figure 28:
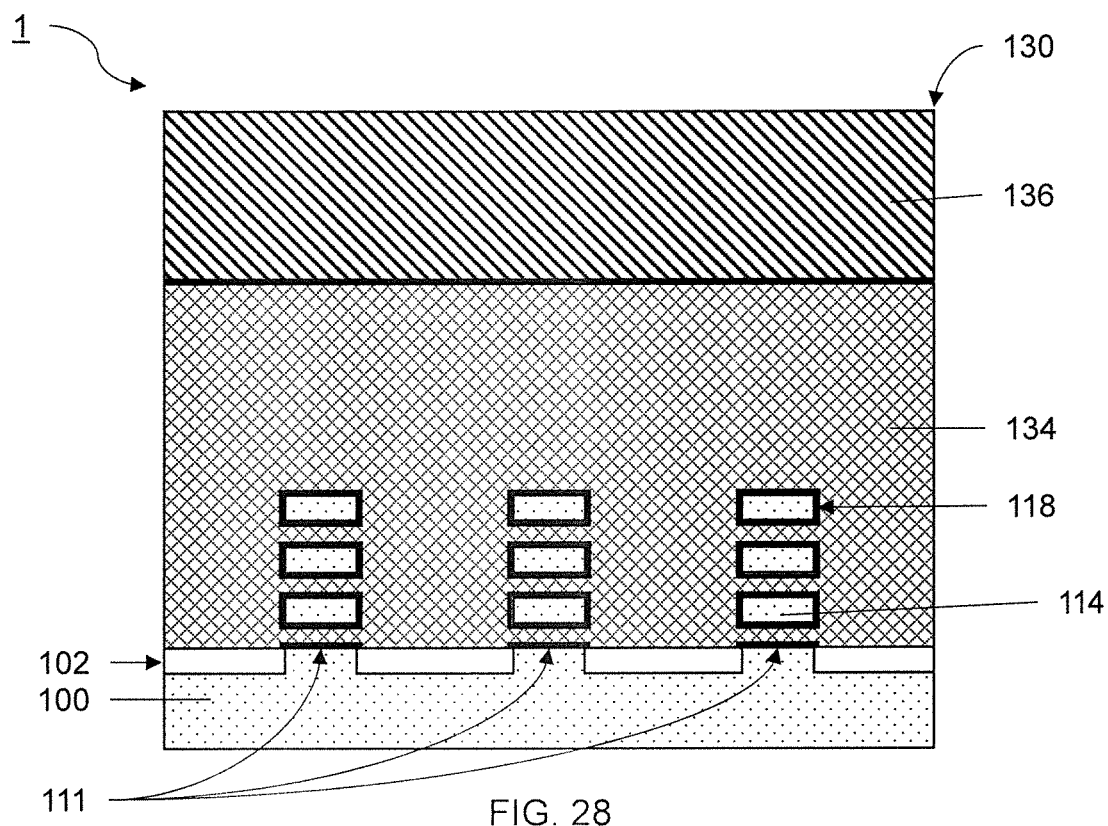
FIG. 28 is a cross-sectional view taken along line 28-28 of FIG. 27 showing a stacked nanowire fin FET with a gate formed between spacers within a dielectric fill and having unchopped semiconductor nanowires with source/drain regions grown around the semiconductor nanowires, in accordance with an embodiment of the present invention.
Figure 29:
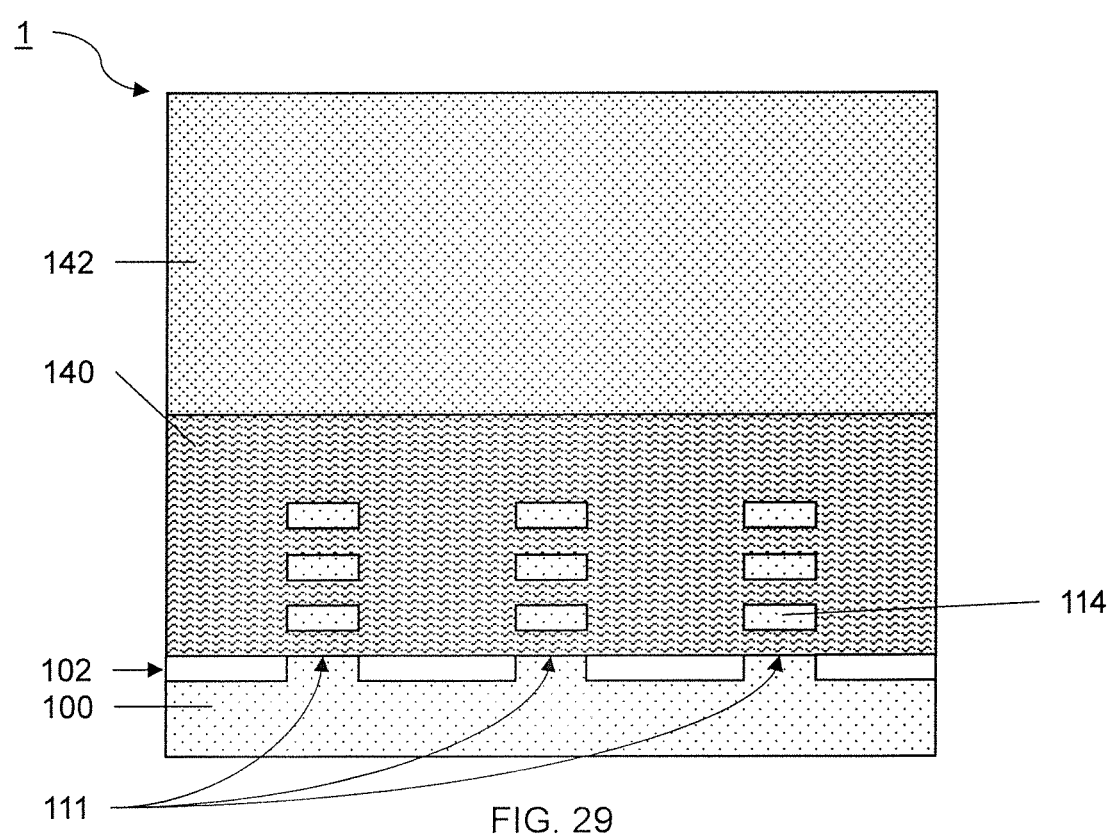
FIG. 29 is a cross-sectional view taken along line 29-29 of FIG. 27 showing a stacked nanowire fin FET with a gate formed between spacers within a dielectric fill and having unchopped semiconductor nanowires with source/drain regions grown around the semiconductor nanowires, in accordance with an embodiment of the present invention.

Referring now to FIGS. 27-29, a stacked nanowire fin FET with a gate formed between spacers within a dielectric fill and having unchopped semiconductor nanowires with source/drain regions grown around the semiconductor nanowires according to an illustrative embodiment of the present invention is illustrated.

Referring to FIG. 27, gates 130 are formed within the hollow gates defined by the gate spacers 132 and inner spacers 116. Forming the gates 130 can include forming a dielectric layer 118 within the gate spacers 132 and inner spacers 116. The dielectric layer 118 can be any suitable dielectric material, including but not limited to, silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum, aluminum, magnesium. The dielectric layer 118 can be formed as part of a deposition process, such as those described above.

A gate conductor 134 is formed within the gate spacers 132 and inner spacers 116 around the semiconductor nanowires 114. The gate conductor 134 can be formed through a suitable deposition process, such as those described above. The gate conductor material can be any suitable conducting material, including but not limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further comprise dopants that are incorporated during or after deposition. In some embodiments, the gate conductor includes a work function metal layer to set the threshold voltage of the nanosheet transistor to a desired value. The work function layer can be a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

Forming the gates 130 can further include forming gate caps 136. The gate caps 136 are formed by recessing the gate conductor 134 down to a desired height. An insulating material such as, e.g., an oxide or a nitride (for example, silicon nitride) is then deposited within the recess of each gate conductor 134 between the gate spacers 132. Accordingly, gates 130 are formed within the ILD 142 of the semiconductor device 10.

The resulting semiconductor device 1 may then undergo subsequent processing steps. Such steps may include, e.g., forming contacts down to the source/drain regions 140, soldering and other connecting steps for connecting to other devices, and any other subsequent process steps for creating and implementing a fin FET. Such implementations may include, e.g., as transistors for a processor or memory device (for example, random access memory (RAM), flash storage, etc.).

Referring to FIG. 28, which depicts a cross section of the semiconductor device 1 along line 28-28 of FIG. 27 where the fins 111 are shown in a portion of the semiconductor device 1 covered by the gate 120 including the dielectric layer 118 covering portions of the semiconductor nanowires 114 within the gate conductor 134 of the gate 130.

Referring to FIG. 29, which depicts a cross section of the semiconductor device 1 along line 29-29 of FIG. 27, where the fins 111 are shown in a portion of the semiconductor device 1 not covered by the gate 130. In this portion of the semiconductor device 10, the fins 111 are covered by the source/drain regions 140 and ILD 142, with the source/drain regions 140 filling in the spaces between the semiconductor nanowires 114.

Figure 30:
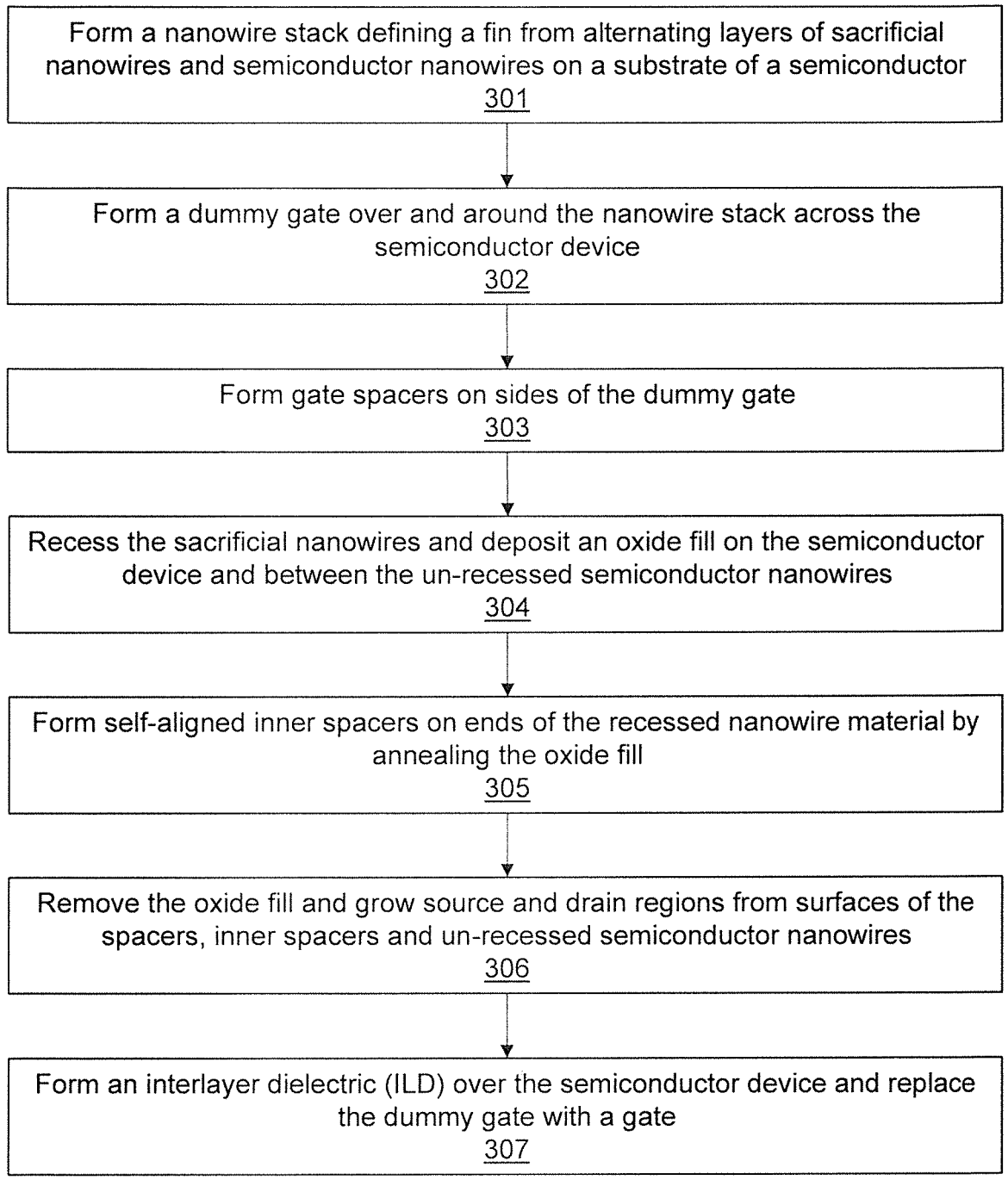
FIG. 30 is a block/flow diagram showing a system/method for forming a stacked nanowire fin FET having unchopped semiconductor nanowires with source/drain regions grown around the semiconductor nanowires, in accordance with an embodiment of the present invention.

Referring now to FIG. 30, a system/method for forming a stacked nanowire fin FET having unchopped semiconductor nanowires with source/drain regions grown around the semiconductor nanowires according to an illustrative embodiment of the present invention is illustrated.

According to aspects of the present invention, and system and method can include a block 301 for forming a nanowire stack 110 defining a fin from alternating layers of sacrificial nanowires and semiconductor nanowires on a substrate of a semiconductor device. The sacrificial nanowires and the semiconductor nanowires can include different materials that are selected to be etchable selectively to each other. For example, the sacrificial nanowires can include, e.g., SiGe while the semiconductor nanowires can include, e.g., Si. Additionally, the nanowire stack can be formed on substrate that can include a monolithic substrate, a silicon on insulation substrate, or other suitable substrate. The substrate can include, e.g., Si, such as monocrystalline Si. However, the substrate can include any suitable semiconductor material. The nanowire stack can be formed on the substrate using a series of depositions of the alternating materials of the nanowires. It can further include masking and etching steps or photolithographic steps. However, other processes are contemplated that are suitable for forming at least one nanowire stack into a fin structure.

At block 302, a dummy gate is formed over and around the nanowire stack across the semiconductor device. The dummy gate be formed by depositing a gate dielectric over and around the nanowire stack. A dummy gate material can then be formed on the gate dielectric. A dummy gate cap can then be formed on the dummy gate material. The dummy gate cap can include an oxide or nitride, or any suitable material for use as a hardmask in subsequent processing steps.

At block 303, gate spacers are formed on sides of the dummy gate. The gate spacers can be formed by a conformal deposition process that depositions a conformal layer of the gate spacer material across the semiconductor device. Horizontal portions of the conformal layer can then be removed by an isotropic etch process including, e.g., RIE. Accordingly, vertical gate spacers are formed on the vertical sides of the dummy gate. The material of the gate spacers can include a suitable low-k dielectric, such as, e.g., an oxide.

At block 304, the sacrificial nanowires can be recessed and an oxide fill deposited on the semiconductor device. The sacrificial nanowires can be recessed using an etch process, such as an isotropic etch process that is selective to the semiconductor nanowires. As a result, the semiconductor nanowires will remain unetched and at full length. The oxide fill can therefore fill the semiconductor device including between the un-recessed semiconductor nanowires. The oxide fill can include, e.g., $GeO_2$ in the case that the sacrificial nanowires include SiGe. The oxide fill can be formed by any suitable deposition process, including those described above.

At block 305, self-aligned inner spacers can be formed on ends of the recessed nanowire material by annealing the oxide fill. The anneal process can include a low-temperature oxygen-free anneal, including, e.g., a nitrogen ambient. Such an anneal process permits an oxide to grow at the interface of the recessed sacrificial nanowires and the oxide fill, thus forming inner spacers that self-align with the gate spacers.

At block 306, the oxide fill is removed and source and drain regions are grown from surfaces of the spacers, inner spacers and un-recessed semiconductor nanowires. The oxide fill can be removed with a wash, such as, e.g., a $H_2O$ wash that is non-destructive to the semiconductor nanowires. Any other process suitable for removing the oxide fill can used that is non-destructive to the semiconductor nanowires. Accordingly, the semiconductor nanowires will not be chopped or recessed, thus providing full length semiconductor nanowires across the semiconductor device that have a large surface area outside of the gate spacers.

Because the semiconductor nanowires have been left unchopped and at full length, the source/drain regions can be grown from surfaces of the semiconductor nanowires, including top and bottom surfaces. As a result, the surface area from which the source/drain regions can be grown is drastically increased due to the large surface area of the semiconductor nanowires. This large surface area for epitaxial growth permits a large surface-to-growth epitaxy that ensures high quality growth of the source/drain regions and reduced contact resistance between the semiconductor nanowires and the source/drain regions compared to source/drain regions grown from chopped semiconductor nanowires. Thus, the performance of the semiconductor device can be increased, including, e.g., improvements in switching speed.

The source/drain regions can be grown by an epitaxially process such as, e.g., molecular beam epitaxy (MBE), vapor phase epitaxy, solid phase epitaxy, liquid phase epitaxy, or other suitable growth process. The epitaxially grown source/drain regions can include a doped material that is doped, e.g., in situ, or through a separate process from the epitaxially growth of the source/drain regions. In the latter case, the source/drain regions can be doped through diffusion or by ion implantation, and can be performed using, e.g., a separate vapor phase epitaxy step.

At block 307, an interlayer dielectric (ILD) is formed over the semiconductor device and the dummy gate is replaced with a gate. The ILD can be deposited by any suitable deposition process, such as those described above, such that the ILD encompasses, and buries and insulated components of the semiconductor device. The ILD can be formed, for example, of a, e.g., low-k dielectric material such as silicon dioxide ($SiO_2$).

Replacing the dummy gates and the at least one nanosheet material can include recessing the dummy gate caps and etching through the dummy gates from between the gate spacers down to the gate dielectric. The sacrificial nanowires and the gate dielectric can be removed from between the gate spacers by etching selective to the semiconductor nanowires. Accordingly, a hollow stacked nanowire/nanosheet gate structure is formed.

Gates are formed within the hollow gates defined by the gate spacers and inner spacers by forming a gate conductor within the gate spacers and inner spacers around the semiconductor nanowires. The gate conductor can be formed through a suitable deposition process, such as those described above. The gate conductor material can be any suitable conducting material, including but not limited to conductive materials described above. Forming the gates can further include forming gate caps by recessing the gate conductor down to a desired height and depositing a suitable insulating material such as, e.g., an oxide or a nitride (for example, silicon nitride).

The resulting semiconductor device may then undergo subsequent processing steps. Such steps may include, e.g., forming contacts down to the source/drain regions, soldering and other connecting steps for connecting to other devices, and any other subsequent process steps for creating and implementing a fin FET. Such implementations may include, e.g., as transistors for a processor or memory device (for example, random access memory (RAM), flash storage, etc.).

Having described preferred embodiments of a system and method (which are intended to be illustrative and not limiting), it is noted that modifications and variations can be made by persons skilled in the art in light of the above teachings. It is therefore to be understood that changes can be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a nanowire transistor, the method comprising:
    depositing a fill material such that the fill material contacts ends of recessed first nanowires of a stack of nanowires between second nanowires of the stack of nanowires extending beyond the recessed first nanowires;
    transforming, by annealing the fill material, portions of the fill material into inner spacers at ends of the recessed first nanowires, the inner spacers being self-aligned with gate spacers formed on sides of a dummy gate disposed over and around the stack of nanowires;
    after forming the inner spacers, removing remaining portions of the fill material;
    growing source and drain regions from surfaces of the second nanowires beyond a width defined by outer surfaces of the gate spacers such that the second nanowires extend into the source and drain regions outside of the width defined by outer surfaces of the gate spacers; and
    forming a gate between the gate spacers, including replacing the dummy gate and the recessed first nanowires with a gate conductor such that the second nanowires extend through the gate conductor.

2. The method as recited in claim 1, wherein the first nanowires include a sacrificial material and the second nanowires include a semiconductor material.

3. The method as recited in claim 1, wherein the fill material includes an oxide fill.

4. The method as recited in claim 3, wherein the oxide fill includes germanium oxide ($GeO_2$) and the first nanowires include silicon germanium (SiGe).

5. The method as recited in claim 4, wherein the remaining portions of the oxide fill are removed with water ($H_2O$).

6. The method as recited in claim 1, wherein the first nanowires are recessed using an isotropic etch.

7. The method as recited in claim 1, wherein the first nanowires are recessed to be disposed within the width defined by the outer surfaces of the gate spacers.

8. The method as recited in claim 1, wherein a plurality of gates is formed over stacks of nanowires, with the first nanowires being recessed to be disposed within the width defined by the outer surfaces of the gate spacers.

9. A method for forming a nanowire transistor, the method comprising:
- forming gate spacers on a dummy gate over a nanowire stack formed on a substrate, the nanowire stack including alternating nanowires of first nanowires and second nanowires;
- recessing each of the first nanowires to form recessed first nanowires such that the recessed first nanowires are disposed within a width defined by outer surfaces of the gate spacers while the second nanowires extend beyond the width defined by the outer surfaces of the gate spacers;
- depositing an oxide fill over the substrate such that the oxide fill is disposed between the second nanowires and in contact with ends of the recessed first nanowires;
- transforming, by annealing the oxide fill, portions of the fill material into inner spacers at the ends of the recessed first nanowires;
- after annealing the oxide fill, removing remaining portions of the oxide fill;
- growing source and drain regions from surfaces of the second nanowires beyond the width defined by the outer surfaces of the gate spacers such that the second nanowires extend into the source and drain regions outside of the gate spacers; and
- replacing the dummy gate and the recessed first nanowires with a gate conductor to form a gate such that the second nanowire extends through the gate conductor.

10. The method as recited in claim 9, wherein the first nanowires include a sacrificial material and the second nanowires include a semiconductor material.

11. The method as recited in claim 9, wherein the inner spacers are self-aligned with the gate spacers.

12. The method as recited in claim 9, wherein the oxide fill includes germanium oxide ($GeO_2$) and the first nanowires include silicon germanium (SiGe).

13. The method as recited in claim 12, wherein the remaining portions of the oxide fill are removed with water ($H_2O$).

14. The method as recited in claim 9, wherein the first nanowires are recessed using an isotropic etch.

* * * * *